US012272519B2

(12) United States Patent
Zeidler et al.

(10) Patent No.: US 12,272,519 B2
(45) Date of Patent: Apr. 8, 2025

(54) METHOD FOR AREA-WISE INSPECTING A SAMPLE VIA A MULTI-BEAM PARTICLE MICROSCOPE, COMPUTER PROGRAM PRODUCT AND MULTI-BEAM PARTICLE MICROSCOPE FOR SEMICONDUCTOR SAMPLE INSPECTION, AND ITS USE

(71) Applicant: Carl Zeiss MultiSEM GmbH, Oberkochen (DE)

(72) Inventors: Dirk Zeidler, Oberkochen (DE); Daniel Boecker, Aalen (DE)

(73) Assignee: Carl Zeiss MultiSEM GmbH, Oberkochen (DE)

( * ) Notice: Subject to any disclaimer, the term of this patent is extended or adjusted under 35 U.S.C. 154(b) by 411 days.

(21) Appl. No.: 17/843,215

(22) Filed: Jun. 17, 2022

(65) Prior Publication Data
US 2023/0005708 A1  Jan. 5, 2023

(30) Foreign Application Priority Data

Jul. 1, 2021 (DE) .......................... 102021116969.0

(51) Int. Cl.
*H01J 37/26* (2006.01)
*H01J 37/153* (2006.01)
*H01J 37/28* (2006.01)

(52) U.S. Cl.
CPC .......... *H01J 37/265* (2013.01); *H01J 37/153* (2013.01); *H01J 37/28* (2013.01)

(58) Field of Classification Search
CPC ........ H01J 37/265; H01J 37/153; H01J 37/28; H01J 37/1474; H01J 2237/2801; G01N 2223/418; G01N 2223/6116; H01L 22/12
(Continued)

(56) References Cited

U.S. PATENT DOCUMENTS 4,130,761 A    12/1978  Matsuda
4,153,843 A     5/1979  Pease
(Continued)

FOREIGN PATENT DOCUMENTS

DE  10 2013 014 976 A1   3/2015
DE  10 2013 016 113 A1   3/2015
(Continued)

OTHER PUBLICATIONS

German Office Action, with translation thereof, for corresponding DE Appl No. 10 2021 116 969.0, dated Apr. 25, 2022.
(Continued)

*Primary Examiner* — Kiet T Nguyen
(74) *Attorney, Agent, or Firm* — Fish & Richardson P.C.

(57) ABSTRACT

A method includes: providing position data for a plurality of areas on the sample which are to be inspected; providing a first raster arrangement of the plurality of individual particle beams, with a single field of view on the sample assigned to each individual particle beam; defining the position of a nominal scanning area in each single field of view in relation to the first raster arrangement, with the dimensions of the nominal scanning area smaller than the complete single field of view; determining an individual position deviation between a nominal scanning area and the area to be inspected for the at least one individual particle beam; changing the first raster arrangement based on the determined individual position deviation to produce a second raster arrangement of the plurality of individual particle beams; and area-wise scanning the sample using the plurality of individual particle beams in the second raster arrangement.

24 Claims, 10 Drawing Sheets

(58) Field of Classification Search
USPC .................................................. 250/310
See application file for complete search history.

(56) References Cited

U.S. PATENT DOCUMENTS

| | | |
|---|---|---|
| 4,200,794 A | 4/1980 | Newberry |
| 4,338,548 A | 7/1982 | Bono |
| 4,742,234 A | 5/1988 | Feldman |
| 5,215,623 A | 6/1993 | Takahashi |
| 5,864,142 A | 1/1999 | Muraki |
| 5,892,224 A | 4/1999 | Nakasuji |
| 5,905,267 A | 5/1999 | Muraki |
| 5,981,954 A | 11/1999 | Muraki |
| 6,107,636 A | 8/2000 | Muraki |
| 6,124,599 A | 9/2000 | Muraki |
| 6,137,113 A | 10/2000 | Muraki |
| 6,323,499 B1 | 11/2001 | Muraki |
| 6,333,508 B1 | 12/2001 | Katsap |
| 6,617,595 B1 | 9/2003 | Okunuki |
| 6,633,366 B2 | 10/2003 | De Jager |
| 6,696,371 B2 | 2/2004 | Butschke |
| 6,787,780 B2 | 9/2004 | Hamaguchi |
| 6,804,288 B2 | 10/2004 | Haraguchi |
| 6,818,911 B2 | 11/2004 | Tamamori |
| 6,835,508 B2 | 12/2004 | Butschke |
| 6,872,950 B2 | 3/2005 | Shimada |
| 6,903,345 B2 | 6/2005 | Ono |
| 6,903,353 B2 | 6/2005 | Muraki |
| 6,917,045 B2 | 7/2005 | Hashimoto |
| 6,919,574 B2 | 7/2005 | Hashimoto |
| 6,943,349 B2 | 9/2005 | Adamec |
| 6,953,938 B2 | 10/2005 | Iwasaki |
| 6,992,290 B2 | 1/2006 | Watanabe |
| 7,005,658 B2 | 2/2006 | Muraki |
| 7,015,467 B2 | 3/2006 | Maldonado |
| 7,060,984 B2 | 6/2006 | Nagae |
| 7,084,411 B2 | 8/2006 | Lammer-Pachlinger |
| 7,091,504 B2 | 8/2006 | Wieland |
| 7,109,494 B2 | 9/2006 | Ono |
| 7,126,141 B2 | 10/2006 | Ono |
| 7,129,502 B2 | 10/2006 | Kruit |
| 7,244,949 B2 | 7/2007 | Knippelmeyer |
| 7,285,779 B2 | 10/2007 | Litman |
| 7,375,326 B2 | 5/2008 | Sender |
| 7,420,164 B2 | 9/2008 | Nakasuji |
| 7,468,507 B2 | 12/2008 | Rogers |
| 7,504,622 B2 | 3/2009 | Elyasaf |
| 7,535,001 B2 | 5/2009 | Sender |
| 7,601,972 B2 | 10/2009 | Nakasuji |
| 7,619,203 B2 | 11/2009 | Elyasaf |
| 7,696,497 B2 | 4/2010 | Rogers |
| 8,035,082 B2 | 10/2011 | Yamazaki |
| 8,134,135 B2 | 3/2012 | Kruit |
| 8,350,214 B2 | 1/2013 | Otaki |
| 8,362,425 B2 | 1/2013 | Han |
| 8,384,051 B2 | 2/2013 | Ozawa |
| 8,598,525 B2 | 12/2013 | Zeidler |
| 8,618,496 B2 | 12/2013 | Wieland |
| 8,704,192 B2 | 4/2014 | Sano |
| 8,748,842 B2 | 6/2014 | Ohashi |
| 8,779,399 B2 | 7/2014 | Yamanaka |
| 8,829,465 B2 | 9/2014 | Tsunoda |
| 8,963,099 B2 | 2/2015 | Yamada |
| 9,153,413 B2 | 10/2015 | Almogy |
| 9,263,233 B2 | 2/2016 | Zeidler |
| 9,336,981 B2 | 5/2016 | Knippelmeyer |
| 9,336,982 B2 | 5/2016 | Zeidler |
| 9,349,571 B2 | 5/2016 | Kemen |
| 9,368,314 B2 | 6/2016 | Nakasuji |
| 9,530,613 B2 | 12/2016 | Rogers |
| 9,536,702 B2 | 1/2017 | Lang |
| 9,607,805 B2 | 3/2017 | Liu |
| 9,653,254 B2 | 5/2017 | Zeidler |
| 9,702,983 B2 | 7/2017 | Eder |
| 9,922,796 B1* | 3/2018 | Frosien ................ H01J 37/153 |
| 9,922,799 B2 | 3/2018 | Li |
| 9,991,089 B2 | 6/2018 | Mueller |
| 10,062,541 B2 | 8/2018 | Ren |
| 10,141,160 B2 | 11/2018 | Ren |
| 10,354,831 B2 | 7/2019 | Kemen |
| 10,388,487 B2 | 8/2019 | Zeidler |
| 10,535,494 B2 | 1/2020 | Zeidler |
| 10,541,112 B2 | 1/2020 | Schubert |
| 10,586,677 B1 | 3/2020 | Okada |
| 10,600,613 B2 | 3/2020 | Zeidler |
| 10,622,184 B2 | 4/2020 | Knippelmeyer |
| 10,643,820 B2 | 5/2020 | Ren |
| 10,741,355 B1 | 8/2020 | Zeidler |
| 10,811,215 B2 | 10/2020 | Zeidler |
| 10,854,423 B2 | 12/2020 | Sarov |
| 10,879,031 B2 | 12/2020 | Ren |
| 10,896,800 B2 | 1/2021 | Riedesel |
| 2009/0014649 A1 | 1/2009 | Nakasuji |
| 2010/0320382 A1 | 12/2010 | Almogy |
| 2014/0197325 A1 | 7/2014 | Kato |
| 2015/0090879 A1* | 4/2015 | Zeidler ................ H01J 37/28 250/311 |
| 2015/0155134 A1 | 6/2015 | Frosien et al. |
| 2015/0357157 A1* | 12/2015 | Mueller ................ H01J 37/10 250/396 R |
| 2016/0284505 A1 | 9/2016 | Ren |
| 2017/0117114 A1 | 4/2017 | Zeidler |
| 2017/0133198 A1 | 5/2017 | Kruit |
| 2019/0333732 A1 | 10/2019 | Ren |
| 2019/0355544 A1 | 11/2019 | Riedesel |
| 2020/0211810 A1 | 7/2020 | Zeidler |
| 2020/0211811 A1 | 7/2020 | Ren |
| 2020/0243300 A1 | 7/2020 | Zeidler |
| 2020/0373116 A1 | 11/2020 | Zeidler |
| 2021/0005423 A1 | 1/2021 | Zeidler |
| 2021/0035773 A1 | 2/2021 | Zeidler |
| 2021/0375581 A1 | 12/2021 | Kastrup |

FOREIGN PATENT DOCUMENTS

| | | |
|---|---|---|
| DE | 10 2014 008 383 A1 | 12/2015 |
| DE | 10 2015 202 172 A1 | 8/2016 |
| EP | 3 618 095 A1 | 3/2020 |
| GB | 2519511 A | 4/2015 |
| GB | 2521819 A | 7/2015 |
| JP | 59184524 A | 10/1984 |
| JP | 60042825 A | 3/1985 |
| JP | 60105229 A | 6/1985 |
| JP | 61263217 A | 11/1986 |
| JP | 2014229481 A | 12/2014 |
| WO | WO 2005/024881 A2 | 3/2005 |
| WO | WO 2007/028595 A2 | 3/2007 |
| WO | WO 2007/028596 A1 | 3/2007 |
| WO | WO 2007/060017 A2 | 5/2007 |
| WO | WO 2011/124352 A1 | 10/2011 |
| WO | WO2013032949 A1 | 3/2013 |
| WO | WO 2017/108444 A1 | 6/2017 |
| WO | WO2020057678 A1 | 3/2020 |
| WO | WO2020064035 A1 | 4/2020 |
| WO | WO2020065094 A1 | 4/2020 |
| WO | WO2020070074 A1 | 4/2020 |
| WO | WO2020151904 A2 | 7/2020 |
| WO | WO 2021/156198 A1 | 8/2020 |
| WO | WO2020249147 A1 | 12/2020 |

OTHER PUBLICATIONS

Taiwan Office Action and Search Report, with translation thereof, for corresponding TW Appl No. 111121244, dated Mar. 27, 2023.
Examination Report and Written Opinion, with translation thereof, for corresponding Netherlands Appl No. NL2032349, dated Jun. 13, 2023.
D. Zhang et al., "Fast, Full Chip Image Stitching of Nanoscale Integrated Circuits," SRI International Princeton United States, 2019.

* cited by examiner

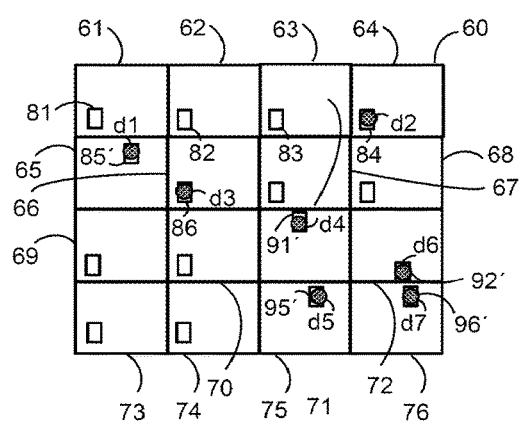
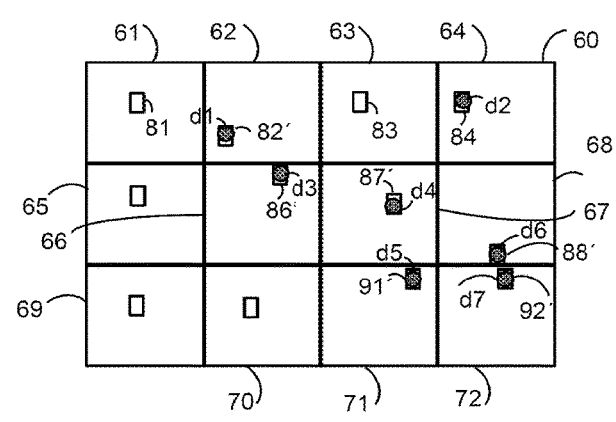
Fig. 3E
Fig. 3F

METHOD FOR AREA-WISE INSPECTING A SAMPLE VIA A MULTI-BEAM PARTICLE MICROSCOPE, COMPUTER PROGRAM PRODUCT AND MULTI-BEAM PARTICLE MICROSCOPE FOR SEMICONDUCTOR SAMPLE INSPECTION, AND ITS USE

CROSS-REFERENCE TO RELATED APPLICATION

The present patent application claims priority of German patent application 10 2021 116 969.0 filed on Jul. 1, 2021, which is incorporated in its entirety in this patent application by reference.

FIELD

The disclosure relates to a method for area-wise inspecting a sample via a multi-beam particle microscope, which may serve for quickly recognizing a defect in semiconductor samples. Moreover, an associated computer program product and associated apparatuses and their uses are disclosed.

BACKGROUND

With the continuous development of ever smaller and ever more complex microstructures such as semiconductor components, it can be desirable to develop and optimize planar production techniques and inspection systems for producing and inspecting small dimensions of the microstructures. By way of example, the development and production of the semiconductor components can involve monitoring of the design of test wafers, and the planar production techniques can involve a process optimization for a reliable production with a high throughput. Moreover, there have been recent demands for an analysis of semiconductor wafers for reverse engineering and for a customer-specific, individual configuration of semiconductor components. Therefore, it can be desirable an inspection mechanism which can be used with a high throughput for examining the microstructures on wafers with a great accuracy.

Typical silicon wafers used in the production of semiconductor components have diameters of up to 300 mm. Each wafer is subdivided into 30 to 60 repeating areas ("dies") with a size of up to 800 mm². A semiconductor apparatus comprises a plurality of semiconductor structures, which are produced in layers on the surface of the wafer by planar integration techniques. Semiconductor wafers typically have a plane surface on account of the production processes. The structure sizes of the integrated semiconductor structures in this case extend from a few µm to the critical dimensions (CD) of 5 nm, with the structure dimensions becoming even smaller in the near future; in the future, structure sizes or critical dimensions (CD) are expected to be less than 3 nm, for example 2 nm, or even under 1 nm. In the case of the aforementioned small structure sizes, defects in the size of the critical dimensions are identified quickly in a very large area. For several applications, the specification expectations on the accuracy of a measurement provided by inspection equipment are even higher, for example by a factor of two or one order of magnitude. By way of example, a width of a semiconductor feature are measured with an accuracy of below 1 nm, for example 0.3 nm or even less, and a relative position of semiconductor structures are determined with an overlay accuracy of below 1 nm, for example 0.3 nm or even less.

The MSEM, a multi-beam scanning electron microscope, is a relatively new development in the field of charged particle systems (charged particle microscopes, CPMs). By way of example, a multi-beam scanning electron microscope is disclosed in U.S. Pat. No. 7,244,949 B2 and in US 2019/0355544 A1. In the case of a multi-beam electron microscope or MSEM, a sample is typically irradiated simultaneously with a plurality of individual electron beams, which are arranged in a field or raster. By way of example, 4 to 10,000 individual electron beams can be provided as primary radiation, with each individual electron beam being separated from an adjacent individual electron beam by a pitch of 1 to 200 micrometres. By way of example, an MSEM can have approximately 100 separate individual electron beams ("beamlets"), which for example are arranged in a hexagonal raster, with the individual electron beams being separated by a pitch of approximately 10 µm. The plurality of charged individual particle beams (primary beams) can be focused on the surface of a sample to be examined by way of a common objective lens.

By way of example, the sample can be a semiconductor wafer which is fastened to a wafer holder that is assembled on a movable stage. During the illumination of the wafer surface with the charged primary individual particle beams, interaction products, for example secondary electrons or backscattered electrons, can emanate from the surface of the wafer. Their start points generally correspond to those locations on the sample on which the plurality of primary individual particle beams are focused in each case. The amount and the energy of the interaction products generally depends on the material composition and the topography of the wafer surface. The interaction products can form a plurality of secondary individual particle beams (secondary beams), which can be collected by the common objective lens and which are incident on a detector arranged in the detection plane as a result of a projection imaging system of the multi-beam inspection system. The detector can comprise a plurality of detection areas, each of which comprises a plurality of detection pixels, and the detector can capture an intensity distribution for each of the secondary individual particle beams. A field of view of for example 100 µm×100 µm can be obtained in the process.

The known multi-beam electron microscopes generally comprise a sequence of electrostatic and magnetic elements. At least some of the electrostatic and magnetic elements are usually adjustable in order to adapt the focus position and the stigmation of the plurality of charged individual particle beams. The known multi-beam systems with charged particles generally comprise at least one cross-over plane of the primary or the secondary charged individual particle beams. Moreover, the known systems generally comprise detection systems to make the setting easier. The known multi-beam particle microscopes generally comprise at least one beam deflector ("deflection scanner") for collective scanning of an area of the sample surface via the plurality of primary individual particle beams in order to obtain a field of view of the sample surface. Further details regarding a multi-beam electron microscope and a method for operating same are described in the German patent application with the application Ser. No. 102020206739.2, filed on May 28, 2020, the disclosure of which is incorporated in full in this patent application by reference.

Production processes in semiconductor technology are typically extremely complex and can comprise a plurality of sensitive method steps, and so inspection methods are assigned an important role. Single beam inspection systems are often used to recognize defects within the scope of semiconductor production. However, scanning an entire sample surface can be very time-consuming and, for this reason too, there is an interest in accelerating methods for recognizing defects or analysing defects. Therefore, a multi-step procedure is often carried out in this case: By way of example, comparatively fast optical inspection systems (which operate for example at wavelengths of the visible range or up into the UV range) are initially used to search for the basic occurrence of defects—without then however being able to examine these in more detail via the optical inspection system on account of the low resolution. However, the approximate position of the defects on the sample is usually determined by sophisticated statistical methods. These positions can then be examined in more detail using an inspection system with a better resolution, for example a scanning electron microscope. In this context, the scanning electron microscope is typically not used to scan the entire sample surface but only the positions or areas identified as being of interest or suspected of harbouring a defect. Thus, use can then be made of an area-wise inspection ("area inspection") instead of the time-consuming full inspection. Another variant lies in the use of already available prior knowledge about the sample, for example GDS data, in order to determine areas of interest for a more accurate inspection and then examine these with high resolution.

In principle, it can be desirable to be able to use the speed features normally offered by a multi-beam electron microscope over an individual beam electron microscope even within the scope of the area inspection.

EP 3 618 095 A1 discloses the use of a multi-beam electron microscope for recognizing defects. In this context, a sample is scanned area-wise. However, the speedup achievable here in comparison with an individual beam system is, as a general matter, not yet sufficient.

WO 2017/108444 A1 discloses a multiple column multi-beam particle beam system applying a plurality of columns and using an area-wise sample inspection for the purpose of defect detection. Different raster arrangements can be set. However, even with this system, the increase in speed that can be achieved compared to a single beam system is, in general, still insufficient.

US 2020/0211811 A1 discloses a multi-beam particle microscope in which an adjustment procedure for a raster arrangement is described.

D. Zhang et al, "*Fast, Full Chip Image Stitching of Nanoscale Integrated Circuits*," SRI International Princeton United States, 2019, describes semiconductor inspection or defect detection in general terms using a Zeiss multi-beam particle microscope.

DE 10 2014 008 383 A1 discloses a particle beam system and a method of operating a particle optical system. In this method, the imaging scale, a convergence of the beam path, and a rotation of a regular raster array can be set.

US 2010 0320382 A1 discloses a multi-beam electron microscope in which at least a single beam can also be individually influenced.

US 2016/0284505 A1 discloses a multi-beam particle microscope with a tilted virtual multisource array for correction of off-axis aberrations.

SUMMARY

The present disclosure seeks to provide an improved and, for example, a faster method for area-wise inspecting a sample, the method operating via a multi-beam particle microscope.

A simple transfer of known methods for area-wise inspecting samples from single beam systems to multi-beam systems is, as a general matter, not possible according to the analysis by the inventors. Thus, simply replacing an individual beam system with a multi-beam system is, general, not sufficient in this type of sample inspection. Instead, the following initial situation can arise.

Multi-beam particle microscopes exist both in the form of multi-column systems and in the form of single column systems. In multi-column systems, each individual particle beam passes through a particle optical unit associated individually therewith. For example, an individual deflector or scan deflector is provided for each individual particle beam such that each individual particle beam can in principle scan a sample or a sample portion in accordance with an individual pattern. Thus, in principle, it would be possible to carry out an area inspection of a sample via a multi-column system. However, an issue arising in practice can be that the individual columns in each case typically have a distance of a few millimetres from one another. As a consequence, the pitch of the individual particle beams upon incidence on a sample also is dependent on the mechanical dimensions of each individual column. As a result, the pitch of the individual particle beams upon incidence on a sample surface is generally significantly larger than a field of view typically to be scanned overall within the scope of recognizing defects, to be precise typically by approximately three orders of magnitude. Therefore, at least currently, an area inspection via a multi-column system is only possible with restrictions.

There is a fundamentally different situation in the case of systems operating using a single column. In the case of single column systems, the individual particle beams pass through substantially global lens systems, that is to say they pass through the same optical unit. Naturally, this does not preclude even individual particle beams being influenced on an individual basis at selected positions in the particle-optical beam path (for example, within the scope of a beam correction). As a matter of principle, the distance between the individual particle beams or the pitch is significantly smaller in single column systems than in multi-column systems. As a result, it is possible for the single fields of view (sFOVs) of the individual particle beams to overlap in the case of single column systems. This therefore can be a feature provided compared to certain other the multi-column systems as described above. Conversely, however, there can be an issue that the positions of the individual particle beams in single column systems are basically specified by way of the utilized multi-beam generator. Moreover, individual particle beams in a single column system are guided over a sample surface via a global scan deflector, for example via a global magnetic or electrostatic scan deflector, which deflects all particle beams uniformly by way of the same field. Typically, this global scan deflector or collective scan deflector is situated at a crossover point of all beams in the vicinity of the objective lens (in the vicinity of what is known as the crossover).

Against this background it is possible to replace the collective beam deflector with individual scan deflectors. In principle, then it is also possible to allow each individual particle beam of a single column system to scan a part of the single field of view assigned thereto, on an individual basis and hence also in certain areas. From a technical point of view, this solution involves a plurality of fast individual deflectors; typically, operation of a scan deflector is of the order of a few MHz, for example of the order of approximately 80 MHz. Moreover, a multi-beam particle microscope always operates in vacuo and the fast scan deflectors are accordingly also situated in the vacuum. Guiding radio-frequency signals in a vacuum involves special technical measures and the occurrence of noise signals are specifically suppressed. Nevertheless, this is a possible realization.

However, the disclosure follows a different mechanism which avoids the radiofrequency issue in the case of individual particle beam systems with individual scan deflectors. This is because it is possible to keep the collective scan deflector in the case of single column systems and hence keep the control of the scan deflector fundamentally unchanged. Details regarding the control of a collective scan deflector are then described in the patent application PCT/EP2021/052293, filed on 1 Feb. 2021, which was not yet laid-open at the priority date of this patent application and the disclosure of which is incorporated in its entirety in this patent application by reference.

A basic concept of the disclosure lies in changing the raster arrangement of the individual particle beams, with which these scan over a surface of the sample, in such a way that this raster arrangement is suitable for an area inspection of the sample, and to be precise not via individual scan deflectors in place of the collective scan deflector, but by other mechanisms. It is an important insight that this adjustment of the raster arrangement are implemented only once per multi-field of view (mFOV), that is to say comparatively slowly. Once the raster arrangement has been adjusted, it is then also possible, as previously, to scan the sample in certain areas via the collective scan deflector. A deflector can thus be controlled at a low frequency or with a low data rate of the order of only a few Hz for the purposes of the individual deflection of individual particle beams. In principle, the technical mechanism to this end are already present even in the case of existing single column systems, one can only accordingly develop the workflow according to which the multi-beam particle microscopes operate. Naturally, this does not preclude the additional provision of separate technical mechanisms in addition to the existing systems in order to realize the individual deflection of individual particle beams for the purposes of producing a specifically adjusted raster arrangement on the areas to be inspected.

Specifically, according to a first aspect, the disclosure relates to a method for area-wise inspecting a sample via a multi-beam particle microscope which operates using a plurality of individual charged particle beams, the method including the following steps:

providing position data for a plurality of areas on the sample which are to be inspected;

providing a first raster arrangement of the plurality of individual particle beams, with a single field of view (sFOV) on the sample being assigned to each individual particle beam;

defining the position of a nominal scanning area in each single field of view (sFOV) in relation to the first raster arrangement, with the dimensions of the nominal scanning area being smaller than the complete single field of view (sFOV);

assigning a nominal scanning area to an area to be inspected for at least one individual particle beam;

determining an individual position deviation between the nominal scanning area and the area to be inspected, assigned thereto, for the at least one individual particle beam; changing the first raster arrangement in accordance with the respectively determined individual position deviation and thereby producing a second raster arrangement of the plurality of individual particle beams such that the assigned areas to be inspected can be scanned in a targeted fashion; and area-wise scanning the sample using the plurality of individual particle beams in the second raster arrangement.

The term "area-wise inspecting the sample" is understood to mean a sample inspection in which none of the charged individual particle beams scans over its full single field of view (sFOV). In this case, the term "area-wise" indicates that areas where scanning is superfluous, for example because no defects are suspected there, are not scanned either.

The individual charged particle beams can be, e.g., electrons, positrons, muons or ions or other charged particles. The multi-beam particle microscope can be a system that operates with a single column. However, in principle it is also possible to carry out the method according to the disclosure via a multi-column system.

According to the disclosure, position data for a plurality of areas on the sample which are to be inspected are initially provided. In this context, these position data may already be known in advance; however, it is also possible that these are only even generated within the scope of the method. The position data specify the positions on the sample of areas to be inspected. The sizes of the areas to be inspected on the sample can be dimensioned identically in each case; however, the areas to be inspected may also have different dimensions. By way of example, the centre or centre of mass of an area to be inspected can be used as its position; however, it is also possible to reference a certain corner of an e.g. rectangular or square area to be inspected, for example, and other realizations are also conceivable. By way of example, the areas to be inspected can be areas where defects are suspected or optionally have already been detected via other methods. An individual area to be inspected may for example have a dimension of a few $\mu m^2$, for example 1 $\mu m^2$ or 2 $\mu m^2$, in the case of a defect detection for semiconductors. When defining the size of an area to be inspected, the accuracy with which the position of a defect may even be known in advance should also be taken into account.

According to the disclosure, a first raster arrangement of the plurality of individual particle beams is provided, with a single field of view (sFOV) on the sample being assigned to each individual particle beam. This raster arrangement can be a regular raster arrangement of the individual particle beams. In this case, the raster arrangement of the plurality of individual particle beams corresponds to the raster arrangement of the individual fields of view on the sample. Optionally, the single fields of view have a rectangular or a square form; they can be arranged next to one another in such a way that a hexagonal structure overall arises. In this case, the individual particle beams are also arranged in a hexagonal pattern with respect to one another. In this case, it can be desirable for the number of the individual particle beams is $3n(n-1)+1$, where n is any natural number. In the case of such an arrangement, the arising multi-fields of view (mFOVs) can also be joined to one another by tessellation. However, it should be once again emphasized here that the method according to the disclosure contains an aria-wise sample inspection and that it is not the entire sample surface which is scanned. This applies to each individual particle beam.

In addition to the pattern produced by the raster arrangement, a raster arrangement is defined according to the disclosure by absolute values which further describe this pattern. The distance between the individual particle beams or the single fields of view additionally characterizes the raster arrangement, the same applies to the orientation/rotation of the raster arrangement. The global position of the raster arrangement in relation to the sample may also be an additional characteristic. In general, it is not only the position of a first raster arrangement on the sample that should be defined but (also) a position of a multi-field of view (mFOV) on the sample that should be defined within the scope of a workflow. In the process, it is also possible to optimize the position (and rotation) of the multi-field of view (mFOV).

It is this first raster arrangement with which the multi-particle microscope would actually scan the sample in the case of not an area inspection but a full inspection of the sample. Basic settings of the multi-particle microscope have been applied for this first raster arrangement. It is therefore advisable to reference deviations from this first raster arrangement below, when the raster arrangement and/or the positions of individual particle beams in this raster arrangement are changed relative to one another according to the disclosure.

According to the disclosure, a nominal scanning area in each single field of view (sFOV) is defined in relation to the first raster arrangement, with the dimensions of the nominal scanning area being smaller than the complete single field of view (sFOV). Thus, the nominal scanning areas are those portions of the single field of view which would be scanned during the area inspection of the sample, to the extent that the first raster arrangement would be used to this end. In this case, the nominal scanning areas should be chosen to be as small as possible and as large as desired in order to facilitate a sample inspection that is as fast as possible and, then again, in order to be sure of being able to scan structures or defects of interest accurately enough or completely enough even within a nominal scanning area. Therefore, the dimensions of areas to be inspected can be less than or equal to the dimensions of the nominal scanning areas. The nominal scanning areas may not defined by defining a standard position that is always the same. Thus, unlike EP 3 618 095 A1, it is not the case that the central position of an individual particle beam in a single field of view is always used as nominal scanning position or as nominal scanning area. Instead, the choice of a nominal scanning position according to the disclosure can be made in such a way that the latter can be desirable for the subsequent scanning of the areas to be inspected. For example, the nominal scanning position may differ from multi-field of view to multi-field of view (mFOV); then, it is redefined in each case.

According to the disclosure, a nominal scanning area is assigned to an area to be inspected for at least one individual particle beam, optionally for more than one individual particle beam. Thus, matching is carried out, within the scope of which as many areas to be inspected as possible are assigned to nominal scanning areas. It is possible that there are more areas to be inspected than nominal scanning areas, it is possible that the numbers of these correspond, but it is also possible that there are more nominal scanning areas than areas to be inspected. In this case, the areas to be inspected can be arranged in the same single field of view as the nominal scanning area assigned thereto. However, it is also possible to deviate from this rule, especially if an area to be inspected of a first single field of view is located near a boundary to an adjacent second single field of view, for example if in this case the nominal scanning area is also arranged in the more closely adjacent edge area of the second single field of view. It is not mandatory for a nominal scanning area to be assigned to each area to be inspected. Nevertheless, this is possible.

Following the described assignment step, an individual position deviation is determined between the nominal scanning area and the area to be inspected, assigned thereto, for the at least one individual particle beam. This method step therefore relates to all pairs of nominal scanning areas and areas to be inspected, which are assigned to one another. In this case, a position deviation can be defined on the basis of the properties of the nominal scanning areas and of the areas to be inspected. According to an embodiment of the disclosure, the dimension of a nominal scanning area corresponds to the dimension of an area to be inspected and, within the scope of the compensation of the position deviation between the nominal scanning area and the area to be inspected assigned thereto, these two areas can be exactly aligned with one another. However, it is also possible for the dimensions of the nominal scanning area to be e.g. larger than the dimensions of the area to be inspected. Then, a position deviation can be defined, for example, by the position deviation of the centres or centroids of firstly the nominal scanning area and of secondly the area to be inspected. If the dimensions of the nominal scanning area and of the area to be inspected are suitably dimensioned, a position change of a preselected corner, for example top left, can also be used as an individual position deviation. Other definitions of an individual position deviation are likewise possible. What is important is that an area to be inspected is located within the displaced nominal scanning area following a displacement of nominal scanning areas according to the determined position deviation, and hence that said area to be inspected is scannable.

Thus, the determined individual position deviation serves to change a first raster arrangement and to produce a second raster arrangement which allows the areas to be inspected to be scanned in targeted fashion by scanning the displaced nominal scanning areas. To this end, the first raster arrangement is changed in accordance with the respectively determined individual position deviation and a second raster arrangement of the plurality of individual particle beams is produced thereby such that the assigned areas to be inspected can be scanned in a targeted fashion. This second raster arrangement therefore reproduces as completely as possible the arrangement which areas to be inspected adopt in the multi-field of view of the multi-particle microscope. In this case—as already described above—it is possible that not all areas to be inspected are covered by the second raster arrangement. It is also possible that some individual particle beams are not assigned to any area to be inspected. A complete scan of a sample would not be obtained if said sample were to be scanned not only in certain areas using the second raster arrangement; instead, some areas would be scanned twice and others would not be scanned at all.

The generation of the second raster arrangement is followed by the scanning of the sample in certain areas using the plurality of individual particle beams in the second raster arrangement. In this case, this second raster arrangement differs from the first raster arrangement at least in respect of the position of one individual particle beam in the raster during scanning. The pattern of the second raster arrangement differs from the pattern of the first raster arrangement, that is to say relative distances between the individual particle beams are changed in part. The difference between the two raster arrangements does not consist in a modified general pitch (by contrast, this general pitch, and hence the size of the single fields of view, remains the same) and also does not consist in a twist of the rasters with respect to one another.

It is reasonable not to define the position of the nominal scanning areas standardly (e.g., always top left corner) in each single field of view but to define this on the basis of the position data for the areas to be inspected per multi-field of view. In this case, purely the act of defining the position of the nominal scanning area already allows some of these nominal scanning areas to be aligned with areas on the sample to be inspected.

According to an embodiment of the disclosure, the production of the second raster arrangement comprises an individual deflection of at least one individual particle beam, such as of a plurality of individual particle beams. The original first raster arrangement is changed by this individual deflection of one or more individual particle beams, and the second raster arrangement is produced. Optionally, a scan deflector is not used for this individual deflection. As a consequence, even a possibly already present collective scan deflector can be used for the scanning of the sample in certain areas using the plurality of individual particle beams in the second raster arrangement. Then, the individual deflection is implemented in the particle-optical beam path upstream of the passage through the collective scan deflector. By way of example, a multi-deflector array can be used for individual deflection. For example, it is possible to use a multi-stigmator that is already present anyway in many multi-beam particle microscopes with one column. Possible embodiments of devices for the individual deflection of the individual particle beams will still be discussed in more detail further down in this patent application.

According to an embodiment of the disclosure, an overwhelming number of the assigned areas to be inspected are assigned to those nominal scanning areas which are located in the same single field of view (sFOV) in relation to the first raster arrangement. In this case, overwhelming means at least one more. This is because a deflection of an individual particle beam, as it were to displace the nominal scanning area onto the area to be inspected, can be simple within the same single field of view. Then, only a weak deflection of the individual particle beams is even involved.

According to an embodiment of the disclosure, mutually adjacent single fields of view (sFOVs) of the multi-beam particle microscope overlap, and/or the multi-beam particle microscope comprises a single column. The overlap of mutually adjacent single fields of view is standard in multi-beam particle microscopes having a single column.

According to an embodiment of the disclosure, the provision of the first raster arrangement comprises the setting of a regular pitch between mutually adjacent individual particle beams. By way of example, such a regular pitch can be implemented in the case of a hexagonal arrangement of the individual particle beams with respect to one another. Setting the pitch is possible within certain limits in the case of existing multi-beam particle microscopes, even in the case of single column systems. Details in this respect can be gathered from U.S. Pat. No. 9,991,089 B2, for example, the disclosure of which is incorporated in this patent application in full by reference. It is also possible to set the pitch on the basis of a chosen pixel dimension and, For example, optimally set said pitch to the effect of being able to achieve a speed increase during the scanning procedure. Details in this respect can be gathered from, e.g., US 2020/0243300 A1, the disclosure of which is incorporated in this patent application in full by reference.

The pitch can be set according to one of the following criteria:
increasing the number of areas to be inspected which are located within a multi-field of view (mFOV);
uniformly distributing the areas to be inspected among the single fields of view (sFOVs). If it is possible to increase the number of areas to be inspected per multi-field of view, this directly leads to a further increase in the speed of the method according to the disclosure. The criterion of the uniform distribution may likewise contribute to a speedup: What could happen in the case of a small pitch between the individual particle beams is that areas to be inspected are present only in approximately half of all single fields of view, but then it is possible that for example two areas to be inspected are arranged in one single field of view. The second half of the single fields of view would then possibly even remain empty. In the case of a uniform distribution and, for example, a pitch twice the size, situations are conceivable in which one area to be inspected, for example, is assigned to each single field of view or else, for example, exactly two areas to be inspected are assigned to each single field of view. In the latter case, the method according to the disclosure could then be performed with a first set of the nominal scanning areas per single field of view and with a second set of nominal scanning areas in the same single field of view. Naturally, in this case the aforementioned criteria are possibly weighed against one another. This is down to the judgement of a person skilled in the art.

According to an embodiment of the disclosure, the provision of the first raster arrangement comprises an optimization of the first raster arrangement by changing the position, the pitch and/or the rotation of the first raster arrangement. Thus, in the process, the provided first raster arrangement is not simply used standardly, unlike in EP 3 618 095 A1. The optimization of the first raster arrangement contributes significantly to a speed increase of the claimed method.

Optionally, the first raster arrangement is optimized according to at least one of the following criteria:
arranging each area to be inspected completely within a single field of view (sFOV) of the raster arrangement;
maximizing the distance between areas to be inspected and edges of single fields of view (sFOVs);
uniformly distributing areas to be inspected among the single fields of view (sFOVs).

If the areas to be inspected are each arranged in full in one single field of view (sFOV) of the raster arrangement, an area to be inspected is not broken apart by the raster arrangement. Consequently, it is easier to in fact also fully inspect an area to be inspected. The criterion of maximizing the distance between areas to be inspected and edges of the single fields of view (sFOVs) has a similar effect. However, it is also for example possible that this criterion alone does not provide the desired result as it may also be desired to precisely separate two areas to be inspected, which adjoin one another comparatively closely, by way of a boundary of the first raster arrangement. Uniformly distributing areas to be inspected among the single fields of view (sFOVs) contributes substantially to a speedup of the method according to the disclosure. The method according to EP 3 618 095 A1 discloses something else: According to the method disclosed therein, the entire scan time is determined by a single field of view, in which most of the areas to be inspected are arranged. Thus, an individual particle beam of this single field of view will scan a plurality of areas to be inspected while the individual particle beams that are assigned to other single fields of view are idle and do not carry out any, or any meaningful, scanning process. The speedup according to EP 3 618 095 A1 is specified in the document to be a factor of approximately 6. In comparison with the number of individual particle beams with which current multi-beam electron microscopes operate, this speedup is relatively low and consequently worthy of improvement. A significant further speedup can be achieved via the method according to the disclosure of the present patent application.

According to an embodiment of the disclosure, the areas to be inspected are distributed among the single fields of view (sFOVs) in such a way that a predetermined proportion of all mFOVs only have single fields of view which have either no areas to be inspected or only a predetermined number of areas to be inspected, and only have a small probability of having more than this number. In principle, this is only possible whenever the first raster arrangement has also been chosen in a targeted fashion or optimized as described above. By way of example, it is possible that more than 95%, more than 98% or more than 99% of all mFOVs only have single fields of view (sFOVs) which have either no areas to be inspected or only a predetermined number of areas to be inspected, and only have a small probability of having more than this number. In this case, each single field of view may have for example exactly one area to be inspected or no area to be inspected. However, it is also possible that the predetermined proportion of all single fields of view have exactly two or exactly four or any other exact number of areas to be inspected. From this, the feature of the speedup can be evident: If the very overwhelming proportion of single fields of view have the same number of areas to be inspected, but no more, then practically no individual particle beams are idle when scanning the areas to be inspected because a further scan would be involved in order to image the remaining areas to be inspected in a few sFOVs. Should a single field of view have more than the desired number of areas to be inspected in rare individual cases, it is possible not to scan this or these excess areas to be inspected, or to nevertheless do this because the loss of speed is only small. For the overall assessment of a sample, this small lack is acceptable, or else a small loss of speed.

According to an embodiment of the disclosure, the method includes the following steps: producing a distance distribution of areas to be inspected from the provided position data; and optimizing the first raster arrangement on the basis of the produced distance distribution. When producing a distance distribution of areas to be inspected, analysis is for example carried out as to what distance mutually adjacent areas to be inspected have from one another in each case. In this case, it is for example possible to determine three or four nearest neighbours of an area to be inspected, and to evaluate the distances thereof from one another. However, it is also possible to include in the analysis five, six or seven or more nearest neighbours in the form of areas to be inspected. As a result, it is possible for example to determine average distances of areas to be inspected from one another or else the average distance of adjacent areas to be inspected from one another. The distance distribution then specifies the frequency with which a respectively found distance occurs. Consequently, the distance distribution is also a frequency distribution or can be represented as a histogram. Counting pairs of areas to be inspected twice should naturally be avoided within the scope of this analysis. The first raster arrangement or its characteristic parameters can now be optimized on the basis of the distance distribution produced.

According to an embodiment of the disclosure, a lower limit of a minimum distance between areas to be inspected is chosen in such a way in the distance distribution that a predetermined proportion of all areas to be inspected has a minimum distance greater than or equal to this lower limit; and
the pitch of the first raster arrangement is set to the value of the lower limit.

In this case, the predetermined proportion may be for example at least 95%, such as least 98% or at least 99%. By way of example, what can be achieved in this way is that for example no more than one area to be inspected is provided in each single field of view (sFOV) (and optionally exactly one area to be inspected for the very overwhelming number of all single fields of view). This is because by setting the pitch to the value of the lower limit, said pitch is chosen in such a way that the minimum distance of the areas to be inspected is greater than or equal to the value of the pitch for the very overwhelming proportion of said areas.

Defining the position of the nominal scanning areas in each single field of view (sFOV) can also follow specific criteria which further accelerate the method according to the disclosure and/or increase the accuracy of the method according to the disclosure. The position of the nominal scanning areas in each single field of view (sFOV) can be defined according to at least one of the following criteria:
  maximizing the number of nominal scanning areas which already in the first raster configuration at least partially cover, for example completely cover, the areas to be inspected (individual particle beams which scan these areas to be inspected need not be additionally deflected on an individual basis);
  minimizing the number of individual particle beams which are positioned differently in the second raster configuration in relation to the first raster configuration (this likewise increases the accuracy);
  restricting a position deviation of individual particle beams in the second raster arrangement in comparison with the first raster arrangement (this in turn increases the accuracy).

When applying these criteria, it is also the case that they may have to be weighed up against one another. This is also down to the judgement of a person skilled in the art. It is also possible to define an overall deflection of all individual particle beams in the second raster configuration in comparison with the first raster configuration; what is important for this overall deviation then is the number of the individually deflected individual particle beams, and also their respective degree of deflection. By way of example, instead of allowing one large deviation of a single particle beam, it may be possible to allow a plurality of small deviations of a plurality of individual particle beams if this overall increases the accuracy of the method according to the disclosure.

According to an embodiment of the disclosure, the restriction of the position deviation leads to the position deviation of the individual particle beams being less than twice the pitch or less than the single pitch between mutually adjacent individual particle beams in the first raster arrangement. If this position deviation is less than the single pitch between adjacent individual particle beams in the first raster arrangement, the nominal scanning area and the area to be inspected assigned thereto are in relative proximity to one another, often within the same field of view. In this case, a maximum deflection of an individual particle beam in the same field of view is one sFOV diagonal (measured from one corner to the diametrically opposite corner). If the position deviation is greater than the single pitch, the nominal scanning area and the area to be inspected assigned thereto are in different fields of view. Thus, this type of correction is related to the first raster arrangement in field of view-spanning fashion. However, it is possible to ensure in the process that the individual particle beams do not cross over one another. Therefore, it may also be desirable to restrict the maximum permissible position deviation to less than twice the pitch.

According to an embodiment of the disclosure, a position deviation of individual particle beams in the second raster configuration in comparison with the first raster arrangement is only greater than or equal to the pitch in the first raster arrangement if more areas to be inspected are arranged in the adjacent single field of view (sFOV), in relation to the first raster arrangement, obtained by this position deviation than in the single field of view (sFOV), in relation to the first raster arrangement, originally assigned to the individual electron beam. Thus, nonuniform distributions of areas to be inspected among the single fields of view are at least partly compensated by a comparatively large position deviation. However, such a comparatively large deviation should not be the rule but rather an exception.

Thus, a plurality of secondary individual particle beams may emanate from the same single field of view (sFOV) on the sample in the described embodiment variant. It is desirable to also separate this plurality of second individual particle beams from one another again in the detection path of the multi-beam particle microscope. In principle, there are a number of options to this end: A first option is to arrange a multi-deflector in the secondary path of the multi-beam particle microscope such that the plurality of second particle beams each pass through different openings. By way of example, such a special multi-deflector can be arranged in an intermediate image of the secondary path, and the displacement/magnification/rotation of the intermediate image is set so that the plurality of second particle beams in each case pass through different openings and are correctly adjusted back to the detector channel assigned thereto by way of setting a suitable deflection value. A further solution for separating various secondary beams from the same single field of view during the detection consists of using a detection system with a plurality of detection regions, with this plurality of detection regions being greater than the number of individual particle beams in the primary path or in the second path. This can also be referred to as the plurality of detection regions being once again subdivided into sub-detection regions. For example, it is also possible to use dynamic detection methods for separating a plurality of secondary beams that emanate from the same single field of view. Details in this respect are described in e.g. DE 10 2015 202 172 A1, the disclosure of which is incorporated into this patent application in full by reference.

According to an embodiment of the disclosure, the position data are generated via an optical inspection for recognizing semiconductor defects; and/or the position data are generated on the basis of existing prior knowledge about the sample. By way of example, short wavelength light, for example at 193 nm, can be used within the scope of the optical inspection. Although the defect itself is not recognized at this wavelength, the existence of a defect is recognized on the basis of a sophisticated intensity statistic. Prior knowledge, for example based on design data/construction data of a semiconductor, can be used to define areas to be inspected (critical areas such as sharp edges, etc.).

According to an embodiment of the disclosure, some or all method steps are carried out multiple times within a multi-field of view (mFOV). By way of example, it is possible to define a first set of nominal scanning areas and a second set of nominal scanning areas and optionally further sets of nominal scanning areas for each single field of view. In this case, the multi-field of view then is initially scanned with a second raster arrangement, and subsequently with a third, fourth or further raster arrangement, etc. Thus, the position of the individual particle beams in the raster is changed by individual deflection for each raster arrangement used for scanning.

According to a further embodiment of the disclosure, the method is carried out for a plurality of multi-fields of view (mFOVs) and the sample is displaced relative to the multi-particle microscope (stage move) between the area-wise inspection of various multi-fields of view (mFOVs). A plurality of multi-fields of view means at least two multi-fields of view, but there can be significantly more in practice. In this way, it is possible even to area-wise inspect a relatively large sample surface, or examine the latter for defects.

It is also possible to integrate a step for correcting or optimizing the stigmation for each individual particle beam into the method according to the disclosure. An improvement in the stigmation settings for each individual particle beam involves no extra time and improves the image properties, especially if large deflections of individual particle beams are used within the scope of the area inspection of the sample. By way of example, it is possible to provide a second or further multi-stigmator array in the particle-optical beam path for this subsequent correction or optimization of the stigmation.

According to an embodiment of the disclosure, the multi-beam particle microscope comprises a multi-aperture arrangement having a multi-beam generator and having a multi-stigmator, said multi-beam generator comprising a multi-aperture plate and a multi-lens array, and the multi-stigmator being used to produce the second raster arrangement. Thus, the multi-stigmator is used for the individual deflection of individual particle beams for producing the second raster arrangement. To this end, it can merely be controlled accordingly, with this relating to only a low clock rate of the order of only a few Hz, which is realizable without special technical features. Alternatively, it would be possible for the multi-beam generator to comprise a multi-aperture plate and a multi-deflector array and, in addition thereto, for the multi-aperture arrangement to comprise a multi-stigmator, the multi-stigmator in turn being used to produce the second raster arrangement.

The above-described embodiments of the disclosure can be combined with one another in full or in part, provided that no technical contradictions arise as a result.

According to a second aspect of the disclosure, the latter relates to a method for operating a multi-beam particle microscope, said method including the following steps: setting a first regular raster arrangement, the multi-beam particle microscope being technically configured to be able to scan a sample, using this first regular raster arrangement, via a collective beam deflector (this scanning may occur but need not occur; this feature relates to technical possibility); producing a second irregular raster arrangement by individually deflecting at least one individual particle beam, for example a plurality of individual particle beams, via a multi-stigmator or multi-deflector; and scanning the sample, using the second irregular raster arrangement, via the collective scan deflector.

All terms there are used in conjunction with this second aspect of the disclosure have the same definitions and embodiment variants as already presented in great detail in conjunction with the first aspect of the disclosure. Naturally, the method according to the second aspect of the disclosure can likewise be suitable for an area inspection of a sample in this case. However, it can also be used independently of an area inspection of a sample.

By way of example, the multi-stigmator can be realized as an octupole, the multi-deflector as a quadrupole or octupole.

The second aspect of the disclosure can be fully or partly combined with the first aspect of the disclosure in all embodiment variants, provided this does not lead to technical contradictions.

According to a third aspect of the disclosure, the latter relates to a computer program product having a program code for carrying out the method as described above in conjunction with the first aspect and the second aspect of the disclosure. In this case, the program code can be subdivided into one or more partial codes. The code can be written in any desired programming language.

According to a fourth aspect of the disclosure, the latter relates to a multi-beam particle microscope having a controller configured to control the multi-beam particle microscope according to the method as described above in conjunction with the first aspect of the disclosure and with the second aspect of the disclosure, in each case in a plurality of embodiment variants.

According to a fifth aspect of the disclosure, the latter relates to a multi-beam particle microscope for semiconductor sample inspection, which may for example be configured to carry out the above-described methods, said multi-beam particle microscope having the following features:
- a multi-beam generator, which is configured to generate a first field of a plurality of charged first individual particle beams;
- a first particle optical unit with a first particle optical beam path, which is configured to image the generated first individual particle beams onto a sample surface in the object plane such that the first particle beams impinge the sample surface at incidence locations, which form a second field;
- a detection system with a plurality of detection regions that form a third field, a second particle optical unit with a second particle optical beam path, which is configured to image second individual particle beams, which emanate from the incidence locations in the second field, onto the third field of the detection regions of the detection system;
- a magnetic and/or electrostatic objective lens, through which both the first and the second individual particle beams pass;
- a beam switch, which is arranged in the first particle optical beam path between the multi-beam particle source and the objective lens and which is arranged in the second particle optical beam path between the objective lens and the detection system;
- a collective scan deflector arranged between the beam switch and the sample surface and configured to collectively scan the sample surface using the plurality of charged first particle beams;
- an individual deflector arrangement arranged between the multi-beam particle generator and the collective scan deflector and configured to in each case deflect the first individual particle beams individually, a deactivated individual deflector arrangement or an individual deflection that is identical for all first individual particle beams corresponding to a first raster arrangement of the first individual particle beams and an activated individual deflection that is not identical for all first individual beams corresponding to a second raster arrangement of the first individual particle beams; and
- a controller, the controller being configured for low-frequency control of the individual deflector arrangement for the purposes of producing the second raster arrangement, and the controller being configured for high-frequency control of the collective scan deflector such that portions of the sample surface located in a multi-field of view (mFOV) are scanned using the first individual particle beams in the second raster arrangement.

In this case, the low-frequency control of the individual deflector arrangement or of the individual deflector array is typically implemented at a few Hz, for example in the range from 1 Hz to 20 Hz, for example 10 Hz. By contrast, the high-frequency control of the collective scan deflector is of the order of a few MHz, for example 80 MHz, 90 MHz or 100 MHz or even more. The low-frequency control of the individual deflector arrangement makes carrying out the method according to the disclosure with the aid of the apparatus according to the disclosure significantly easier since additional information for the individual deflector arrangement can be brought into the vacuum at a low data rate. This even applies if various individual particle beams are deflected individually. However, this deflection is only set once or a few times per multi-field of view (if a plurality of sets of nominal scanning areas are present).

According to an embodiment of the disclosure, the multi-beam particle microscope comprises a single column; and the multi-beam generator comprises a multi-aperture plate and a multi-lens array. However, other embodiment variants are also possible, for example a multi-column system or the provision of a multi-beam generator in a single column system comprising a multi-aperture plate and a multi-deflector array.

According to the disclosure, the individual deflector arrangement is arranged between the multi-beam particle generator and the collective scan deflector. Thus, the position of the individual deflector arrangement can be realized in different ways, but it is important here that the arrangement is provided at a position in the particle-optical beam path where the individual particle beams are well separated from one another and a diameter of the individual particle beams is not too large. Moreover, the position of the individual deflector arrangement should be chosen in such a way that in its position there can be a deflection of individual particle beams in the form of a parallel displacement or in the form of a parallel offset. Thus, in general, it is desirable that this individual deflector is not located in an intermediate image plane. Positions of the individual deflector arrangement can therefore be just downstream of the individual beam production, that is to say just downstream of the multi-beam generator, or just upstream or downstream of the intermediate image plane (SG plane) in the particle-optical beam path. However, other positions are also possible. For example, the individual deflector arrangement can be arranged downstream of a condenser lens system in the direction of the particle-optical beam path.

According to an embodiment of the disclosure, the individual deflector arrangement comprises a multi-stigmator arranged just downstream of the multi-beam generator. In this case, this multi-stigmator can be integrated overall in a multi-aperture arrangement, which also comprises the multi-beam generator. This embodiment variant can be simple since the peculiarity lies in the type of control of the multi-stigmator and in the control of the collective scan deflector for the area inspection of a sample. For example, the multi-stigmator can be controlled in low-frequency fashion without issues. By way of example, the multi-stigmator can be realized as an octupole, the multi-deflector as a quadrupole or octupole.

According to an embodiment of the disclosure, the multi-stigmator comprises a chip with a memory and the controller is configured to upload into the memory a sequence of control signals for the multi-stigmator for producing the second raster arrangement, and to activate the next control signal via a trigger signal which characterizes the start of a multi-field of view (mFOV) inspection. Thus, the sequence of control signals is stored or buffered in the memory of the chip, the storing process itself can be implemented once. However, it would alternatively also be possible to supply the multi-stigmator after each stage move, that is to say before the scanning of the next multi-field of view starts, with control signals or data for the specific control.

According to an additional or alternative embodiment variant of the disclosure, the individual deflector arrangement is arranged just upstream or downstream of an intermediate image in the first particle-optical beam path. In this case, the individual deflector arrangement can be formed in one part or in many parts. It is possible that a first part (e.g., in the form of the multi-stigmator) is arranged just downstream of the multi-beam generator and that the second or a further constituent part is arranged just downstream of the intermediate image.

According to a sixth aspect of the disclosure, the latter relates to the use of the apparatus as described above in a plurality of embodiment variants for recognizing semiconductor defects, for example for the area inspection of a sample within the scope of a semiconductor defect recognition. On account of the disclosure, this has been rendered possible for the first time with increased speed.

The various aspects of the disclosure with their diverse embodiment variants can be combined with one another in full or in part, provided that no technical contradictions arise as a result.

BRIEF DESCRIPTION OF THE DRAWINGS

The disclosure will be understood even better with reference to the accompanying figures, in which:

FIGS. 3A-3H schematically show the concept according to the disclosure for the area inspection of a sample via a multi-beam particle microscope, and optimization strategies;

DETAILED DESCRIPTION

Figure 1:
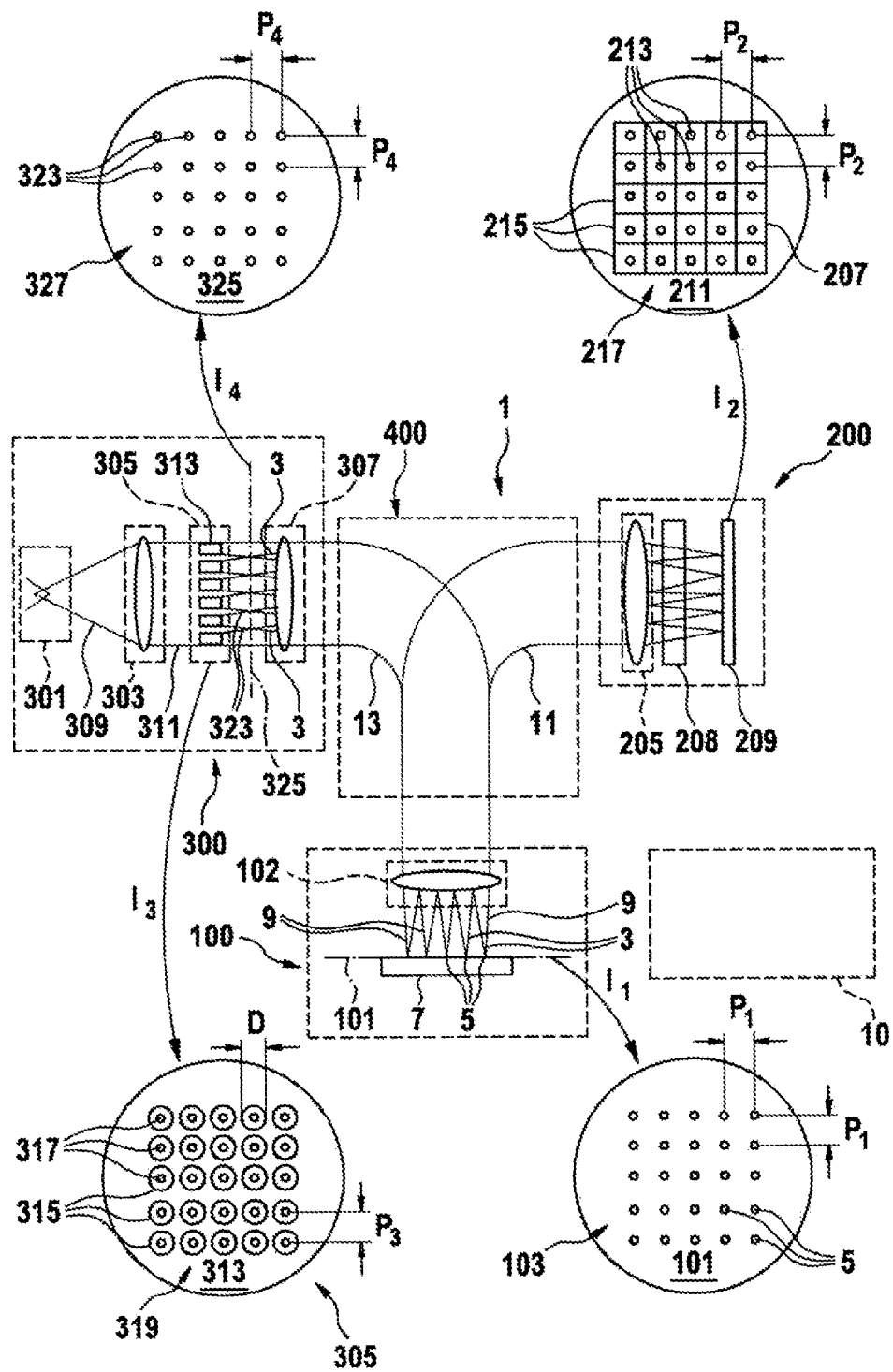
FIG. 1 shows a schematic representation of a multi-beam particle microscope (MSEM)

FIG. 1 is a schematic representation of a particle beam system 1 in the form of a multi-beam particle microscope 1, which uses a plurality of particle beams. The particle beam system 1 produces a plurality of particle beams which strike an object to be examined in order to generate there interaction products, e.g., secondary electrons, which emanate from the object and are subsequently detected. The particle beam system 1 is of the scanning electron microscope (SEM) type, which uses a plurality of primary particle beams 3 which are incident on a surface of the object 7 at a plurality of locations 5 and produce there a plurality of electron beam spots, or spots, that are spatially separated from one another. The object 7 to be examined can be of any desired type, e.g., a semiconductor wafer or a biological sample, and comprise an arrangement of miniaturized elements or the like. The surface of the object 7 is arranged in a first plane 101 (object plane) of an objective lens 102 of an objective lens system 100.

The enlarged detail I1 in FIG. 1 shows a plan view of the object plane 101 having a regular rectangular field 103 of incidence locations 5 formed in the first plane 101. In FIG. 1, the number of incidence locations is 25, which form a 5×5 field 103. The number 25 of incidence locations is a number chosen for reasons of simplified illustration. In practice, the number of beams, and hence the number of incidence locations, can be chosen to be significantly greater, such as, for example, 20×30, 100×100 and the like.

In the depicted embodiment, the field 103 of incidence locations 5 is a substantially regular rectangular field having a constant pitch P1 between adjacent incidence locations. Exemplary values of the pitch P1 are 1 micrometer, 10 micrometres and 40 micrometres. However, it is also possible for the field 103 to have other symmetries, such as a hexagonal symmetry, for example.

A diameter of the beam spots shaped in the first plane 101 can be small. Exemplary values of said diameter are 1 nanometer, 5 nanometres, 10 nanometres, 100 nanometres and 200 nanometres. The focusing of the particle beams 3 for shaping the beam spots 5 is carried out by the objective lens system 100.

The primary particles striking the object generate interaction products, e.g., secondary electrons, back-scattered electrons or primary particles that have experienced a reversal of movement for other reasons, which emanate from the surface of the object 7 or from the first plane 101. The interaction products emanating from the surface of the object 7 are shaped by the objective lens 102 to form secondary particle beams 9. The particle beam system 1 provides a particle beam path 11 for guiding the plurality of secondary particle beams 9 to a detector system 200. The detector system 200 comprises a particle optical unit with a projection lens 205 for directing the secondary particle beams 9 at a particle multi-detector 209.

The detail I2 in FIG. 1 shows a plan view of the plane 211, in which individual detection areas of the particle multi-detector 209 on which the secondary particle beams 9 are incident at locations 213 are located. The incidence locations 213 lie in a field 217 with a regular pitch P2 from one another. Exemplary values of the pitch P2 are 10 micrometres, 100 micrometres and 200 micrometres.

The primary particle beams 3 are produced in a beam producing apparatus 300 comprising at least one particle source 301 (e.g. an electron source), at least one collimation lens 303, a multi-aperture arrangement 305 and a field lens 307. The particle source 301 produces a diverging particle beam 309, which is collimated or at least substantially collimated by the collimation lens 303 in order to shape a beam 311 which illuminates the multi-aperture arrangement 305.

The detail I3 in FIG. 1 shows a plan view of the multi-aperture arrangement 305. The multi-aperture arrangement 305 comprises a multi-aperture plate 313, which has a plurality of openings or apertures 315 formed therein. Midpoints 317 of the openings 315 are arranged in a field 319 that is imaged onto the field 103 formed by the beam spots 5 in the object plane 101. A pitch P3 between the midpoints 317 of the apertures 315 can have exemplary values of 5 micrometres, 100 micrometres, and 200 micrometres. The diameters D of the apertures 315 are smaller than the pitch P3 between the midpoints of the apertures. Exemplary values of the diameters D are 0.2×P3, 0.4×P3, and 0.8×P3.

Particles of the illuminating particle beam 311 pass through the apertures 315 and form particle beams 3. Particles of the illuminating beam 311 which strike the plate 313 are absorbed by the latter and do not contribute to the formation of the particle beams 3.

On account of an applied electrostatic field, the multi-aperture arrangement 305 focuses each of the particle beams 3 in such a way that beam foci 323 are formed in a plane 325. Alternatively, the beam foci 323 can be virtual. A diameter of the beam foci 323 can be, for example, 10 nanometres, 100 nanometres and 1 micrometer.

The field lens 307 and the objective lens 102 provide a first imaging particle optical unit for imaging the plane 325, in which the beam foci 323 are formed, onto the first plane 101 such that a field 103 of incidence locations 5 or beam spots arises there. Should a surface of the object 7 be arranged in the first plane, the beam spots are correspondingly formed on the object surface.

The objective lens 102 and the projection lens arrangement 205 provide a second imaging particle optical unit for imaging the first plane 101 onto the detection plane 211. The objective lens 102 is thus a lens that is part of both the first and the second particle optical unit, while the field lens 307 belongs only to the first particle optical unit and the projection lens 205 belongs only to the second particle optical unit.

A beam switch 400 is arranged in the beam path of the first particle optical unit between the multi-aperture arrangement 305 and the objective lens system 100. The beam switch 400 is also part of the second optical unit in the beam path between the objective lens system 100 and the detector system 200.

Further information relating to such multi-beam particle beam systems and components used therein, such as, for instance, particle sources, multi-aperture plate and lenses, can be obtained from the international patent applications WO 2005/024881 A2, WO 2007/028595 A2, WO 2007/028596 A1, WO 2011/124352 A1 and WO 2007/060017 A2 and the German patent applications DE 10 2013 016 113 A1 and DE 10 2013 014 976 A1, the disclosure of which in the full scope thereof is incorporated by reference in the present application.

The multi-particle beam system furthermore comprises a computer system 10 configured both for controlling the individual particle-optical components of the multi-particle beam system and for evaluating and analysing the signals obtained by the multi-detector 209. It can also be used to carry out the method according to the disclosure. In this case, the computer system 10 can be constructed from a plurality of individual computers or components.

Figure 2A:
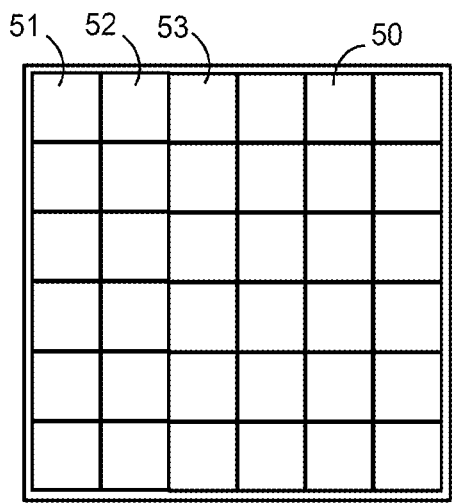
FIGS. 2A-2B schematically show an area inspection of a sample via an individual beam particle microscope.
Figure 2B:
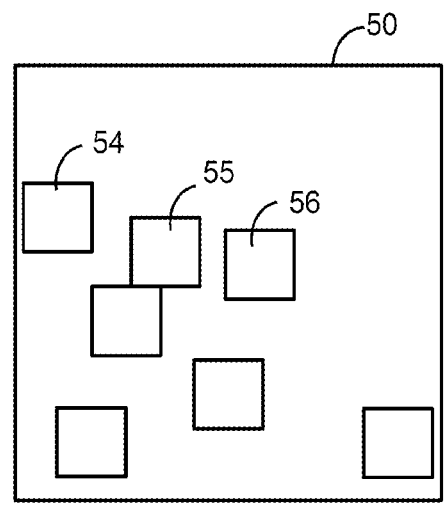

FIG. 2 schematically shows an area inspection of a sample via an individual beam particle microscope. In this case, reference sign 50 indicates a single field of view that can be scanned by an individual beam system. The size of such a single field of view 50 is typically 100 µm×100 µm. FIG. 2A shows a full inspection. In this case, a full inspection via an individual beam electron microscope is comparatively time-consuming and the single field of view to be scanned, totaling 10 000 µm², is comparatively large. If the areas 51, 52, 53 etc. of the field of view 50 in which defects are to be expected are known, either from prior knowledge about the sample to be examined or from a preceding detection, for example via an optical inspection system, it is possible to home in on these areas in a targeted fashion with the scanner of the individual beam system and scan the areas of interest in a targeted fashion: This area inspection is depicted in FIG. 2B. It is already known in the run-up that defects are to be expected at a total of seven sites. Therefore, the positions are homed in on separately and the associated areas of interest 54, 55, 56— as illustrated in FIG. 2B by the small squares— are then scanned. In this case, the areas of interest 54, 55 and 56 are significantly smaller than the overall field of view 50. They typically have an area of approximately 1 µm². Therefore, a speed increase can already be obtained by the area inspection of the sample, approximately by a factor of 1000 here.

Figure 3A:
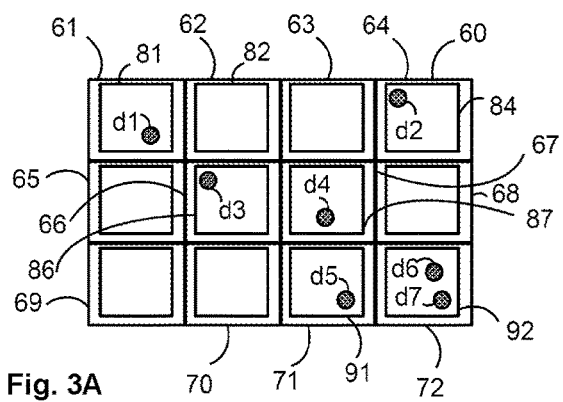

FIGS. 3A-3H schematically show the concept according to the disclosure for the area inspection of a sample via a multi-beam particle microscope. In this case, the individual illustrations a), b), c), d) explain the concept step by step. In the illustrated example, the multi-field of view 60 comprises a total of twelve single fields of view 61 to 72. These single fields of view may directly adjoin one another or slightly overlap one another. This has not been depicted more clearly in FIGS. 3A-3H for graphic reasons. The positions where defects d1 to d7 are to be expected are now known in turn. If a conventional multi-beam particle microscope, for example with a single column system, were now used for the sample inspection, the entire area of the multi-field of view 60 would be scanned according to certain known systems. For example, all single fields of view 61 to 72 would be scanned. However, this would not bring a substantial acceleration of the method. However, it is now possible to choose the areas actually to be scanned to be smaller than the single fields of view 61 to 72. This first approach is depicted in FIG. 3A. Nominal scanning areas 81 to 92, which all have the same size and are all positioned the same in the example shown, are plotted in each single field of view 61 to 72. The size of the nominal scanning areas 81 to 92 has been chosen in such a way that in FIG. 3A all defects d1 to d7 are also in fact located within the nominal scanning areas 81 to 92 and can consequently be scanned. However, this only provides a small speedup since the non-scanned area is very small. Consequently, it would be better to reduce the size of the actual scanning area in each single field of view.

Figure 3B:
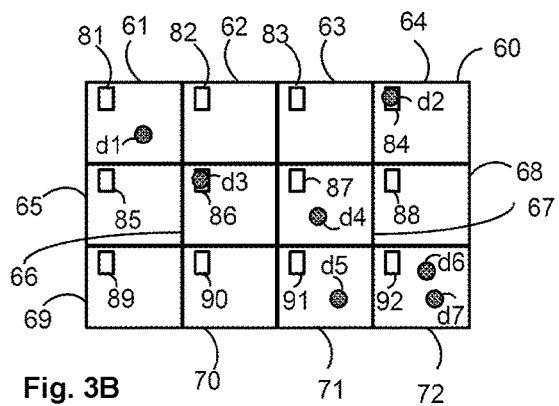

FIG. 3B illustrates this approach: The single fields of view 61 to 72 of the multi-field of view 60 are identical, as are the plotted defects d1 to d7. However, unlike in FIG. 3A, provision is made of nominal scanning areas 81 to 92 which are significantly smaller than those depicted in FIG. 3A. The defects d1 to d7 appear to be comparatively large in the schematic figures. In reality, the defects d1 to d7 are significantly smaller in this context. However, the following circumstances are schematically indicated in the figures: The mechanism which aids in the detection of the defects only have a certain accuracy with which they can find the position of the defects, which generally have a size of only a few nanometres. In principle, this accuracy is already limited by the wavelength of the optical light used to find the defects. Furthermore, the relative positioning accuracy between the optical mechanism and the multi-beam particle microscope is relevant, with this relative positioning accuracy being given for example by the positioning accuracy of the two stages and the positioning accuracy of the individual particle beams with respect to the stage, as well as by further factors.

Thus, it is desirable to ensure that a defect d1 to t7 is located in the area to be inspected. An area to be inspected can typically have edge lengths between 250 nm and 2 µm.

However, in relation to the exemplary embodiment in FIG. 3B, it is not the case that a defect d1 to d7 in fact also comes to rest under each nominal scanning area 81 to 92. This is because the pattern of the defects d1 to d7 does not orient itself on the pattern of the nominal scanning areas 81 to 92. Instead, it is the case that only defects d2 and d3 in single fields of view 64 and 66 overlap with the nominal scanning areas 84 and 86. If the sample were now to be scanned collectively area-wise with the first raster arrangement of the individual particle beams, that is to say in the case of scanning the nominal scanning areas 81 to 92, numerous defects would remain undetected. This, in general, is to be avoided.

Figure 3C:
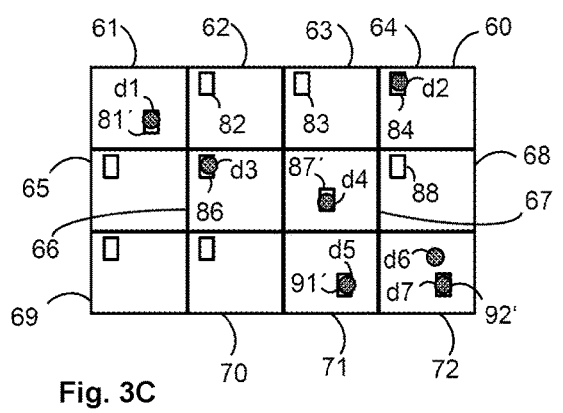

The appropriate approach to this end is illustrated in FIG. 3C: In FIG. 3C, nominal scanning areas were largely assigned to areas to be inspected, that is to say to defects d1 to d7 in this case: The nominal scanning area 81 was assigned to the defect d1. The nominal scanning area 81 are displaced in order to in fact scan the defect d1, a new position is the scanning area 81' in FIG. 3C. Likewise, in field of view 67, the nominal scanning area 87 was displaced to the new position 87' and now covers defect d4. A corresponding statement applies to the nominal scanning area 91, 91' and the defect d5, and to the nominal scanning area 92, 92' and the defect d7. Here, in the example according to FIG. 3C, it is the case that a defect d6 has not been assigned in the single field of view 72. This is because two defects, d6 and d7, are situated in the field of view 72. Moreover, the nominal scanning area 88 in FIG. 3C has not been assigned and therefore not displaced either as there is no defect in the single field of view 68.

Figure 3D:
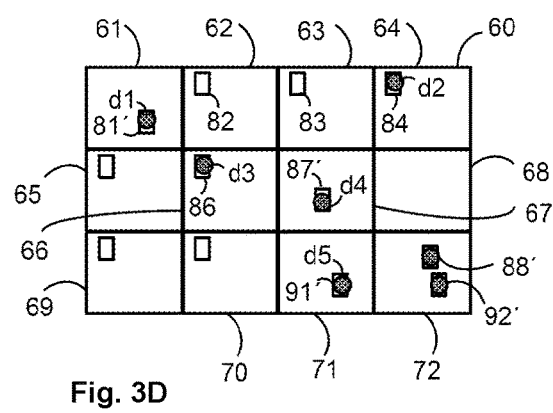

Therefore, a further improvement in the situation has been depicted in FIG. 3D: The depicted situation is identical to that depicted in FIG. 3C, with the exception of the situation depicted in the single fields of view 68 and 72. The nominal scanning area 88 of the field of view 68 is displaced into the single field of view 72 and forms the displaced nominal scanning area 88' there. This now covers the defect d6, which had not been assigned previously. In this way, all defects d1 to d7 have now experienced a respective assignment to nominal scanning areas and as a result of the displacement of the latter it is possible to also in fact inspect defects d1 to d7 when scanning the sample surface.

In FIGS. 3A and 3B, the nominal scanning areas 81 to 92, each of which is non-displaced, correspond to a first regular raster configuration. By contrast, FIGS. 3C and 3D show two different second raster arrangements. According to FIG. 3C, a total of six positions of individual particle beams are displaced in the second raster arrangement in relation to the first raster configuration. In FIG. 3D, a total of seven individual particle beams are displaced in the second raster configuration in relation to the first raster arrangement. The remaining individual particle beams remain unchanged in terms of position; they likewise scan the sample without however scanning defects in the process.

In FIG. 3C, all displacements from nominal scanning areas to actual or displaced scanning areas are smaller than the pitch between the individual particle beams in relation to the first raster configuration. This does not apply to all displaced individual particle beams in FIG. 3D: The exception is formed by the individual particle beam associated with the single field of view 68, which has been displaced beyond the field of view boundary between fields of view 68 and 72 (displaced scanning area 88'). Thus, there now is the situation in FIG. 3D in which secondary beams emanating simultaneously from the same single field of view 72 have to be separated again in the detection path of the multi-beam particle microscope. This can be achieved by virtue of the fact that the resolution in the secondary path is chosen to be high enough such that second individual particle beams between the areas to be inspected can be separated even if they are located close together, and for example are to be assigned to the same single field of view (sFOV) on the sample. By way of example, it is also possible to arrange a multi-deflector array in the secondary path in order to steer one of the second individual particle beams back to the detection unit which is to be assigned to the original field of view (in this case: field of view 58). Alternatively or in addition, a skillful choice of the rotation, magnification and shift parameters of a multi-field of view may contribute to separating the secondary beams again in the detection path. A further option is using a detection system with a plurality of detection regions, the number of detection regions being greater than the number of individual particle beams in the primary path or secondary path of the system. It is also possible to choose a detection region per individual particle beam pair (made up of primary beam and secondary beam), with said detection region in turn being able to be subdivided into sub-detection regions. In this context, reference is made anew to the details in DE 10 2015 202 172 A1 disclosed in relation to the detection system and, for example, in relation to a dynamic detection system, the disclosure of this document being incorporated in full in this patent application by reference.

FIGS. 3E to 3H illustrate optimization strategies within the scope of carrying out the method according to the disclosure. In this context, it is firstly possible to optimize the first raster arrangement and secondly possible to optimize the relative position of the nominal scanning areas. FIG. 3E in this case shows an optimization strategy that is based on a displacement/shift of the first raster arrangement: This displacement is evident from a comparison of the illustration according to FIG. 3D with the illustration according to FIG. 3E: In comparison with the illustration in FIG. 3D, the raster arrangement or the multi-field of view 60 has been displaced downward, to be precise by approximately half the pitch, in FIG. 3E. As a consequence, defects d6 and d7 are no longer assigned to the same single field of view 72 as a result of the displacement of the first raster arrangement. Instead, the defect d6 is in the single field of view 72 and the defect d7 is in the adjacent single field of view 76. Thus, there is a more uniform distribution of the defects d1 to d7 among the single fields of view 61 to 76 as a result of this displacement. Each single field of view has a maximum of one defect d1 to d7. In this case, no defect d1 to d7 is cut by the boundaries of the raster configuration. Moreover, the relative position of the nominal scanning areas 81 to 96 in FIG. 3E is different to the relative position of the nominal scanning areas 81 to 88 according to FIG. 3D: If the nominal scanning areas 81 to 92 of FIG. 3D are located top left in each single field of view 61 to 72, these now are bottom left in the single fields of view 61 to 76 in FIG. 3E. Thus, two things were changed: Firstly, the first raster arrangement was displaced for optimization purposes and secondly the arrangement of the nominal scanning areas in the single fields of view was changed or likewise optimized. In this case, 16 sFOVs were shown here instead of the previous 12, without this representing a loss of generality.

FIG. 3F now illustrates a further optimization strategy by adjusting a magnification of the first raster arrangement. The adjustment of the magnification of the first raster arrangement in this case corresponds to the adjustment of the pitch between the individual particle beams and moreover corresponds to the size of the respective single fields of view 61 to 72, which should be scanned by the plurality of the first individual particle beams. As a result of the magnification or the increase in the pitch, it also is the case in FIG. 3F that each single field of view 61 to 72 has, if at all, only a single defect. However, the same area (even if this includes breaks) can now be scanned with a smaller number of individual particle beams: While seven defects are distributed among a total of 16 single fields of view in FIG. 3E, seven defects are distributed among only 12 single fields of view and, in the process, these defects are distributed uniformly in the example in FIG. 3F. Thus, the variation of the pitch can also decisively contribute to a speedup of the method according to the disclosure.

Figure 3G:
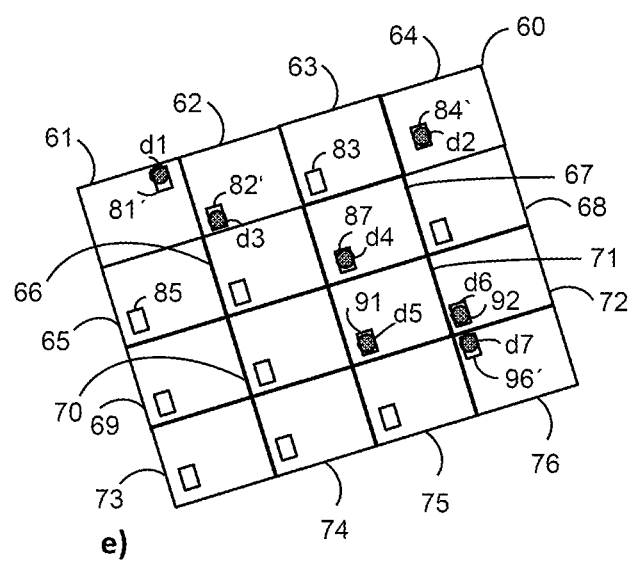

FIG. 3G discloses a further optimization strategy, specifically a rotation of the first raster arrangement. In a manner similar to a displacement of the raster arrangement according to FIG. 3E, what an additional or alternative rotation of the first raster arrangement is also able to achieve is that only a precisely defined number of defects are provided for each single field of view, for example exactly one defect per single field of view in this case here. Thus, the choice of the orientation of the raster arrangement and, linked therewith, the choice of the orientation of a multi-field of view overall is also an important parameter for attaining the best possible speedup.

Figure 3H:
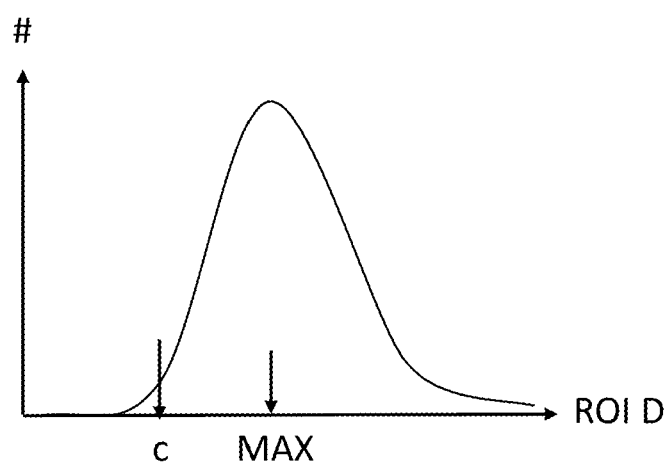

In exemplary fashion, FIG. 3H illustrates the production of a distance distribution of areas to be inspected, or of defects, from the provided position data, and explains further optimization strategies of the method according to the disclosure: A diagram is plotted as to how the pairwise spacing of areas to be inspected, or of defects, is distributed in respect of its frequency. Plotted on the x-axis is the pairwise spacing between adjacent defects, abbreviated to ROI D, while the y-axis plots the number or frequency.

By way of example, to generate such a histogram in relation to FIG. 3F, the distance of the defect d3 from the defects d1, d2, d4 and d5 could be determined. A similar procedure could be carried out for defect d4: In this case, it would be possible for example to determine the distance of the defect d4 from the defects d3, d2, d5 and d6 in each case, etc. It is important here that distances are not counted twice. It allows the case in the histogram depicted in FIG. 3H that there is a most probable distance between areas to be inspected or defects d. As the distribution narrows, a minimum distance between mutually adjacent defects is definable more characteristically and more significantly. Furthermore, FIG. 3H plots a lower limit c. This lower limit or this cut-off c can be used to define the pitch of the first raster arrangement: Only a small number of defects have a minimum distance from adjacent defects that is smaller than the limit c. By way of example, it is possible that more than 95%, more than 98% or even more than 99% of all defects have a distance from their closest neighbour that is greater than or equal to this limit c. It is now possible to set the pitch to be the limit c. As a consequence, what applies to the vast majority of all defects is that these are in each case arranged as a single defect in a single field of view.

In a further variant, the pitch for defining the first raster arrangement is chosen in such a way that a distance distribution of areas to be inspected represents a certain fraction of the pitch to be set: for example exactly ½ pitch or ⅓ pitch or generally 1/n pitch. If the distribution of the histogram is narrow enough, a very large majority of all single fields of view then has either exactly 2, exactly 3 or exactly n defects, or has no defect at all. Thus, in this case it is also possible to obtain a very uniform distribution of areas to be inspected among single fields of view. This very uniform distribution then in turn leads to the desired speedup of the inspection method.

It is possible to further refine or complement the above-described optimization strategies, or to wholly or partly combine these with one another.

Figure 4:
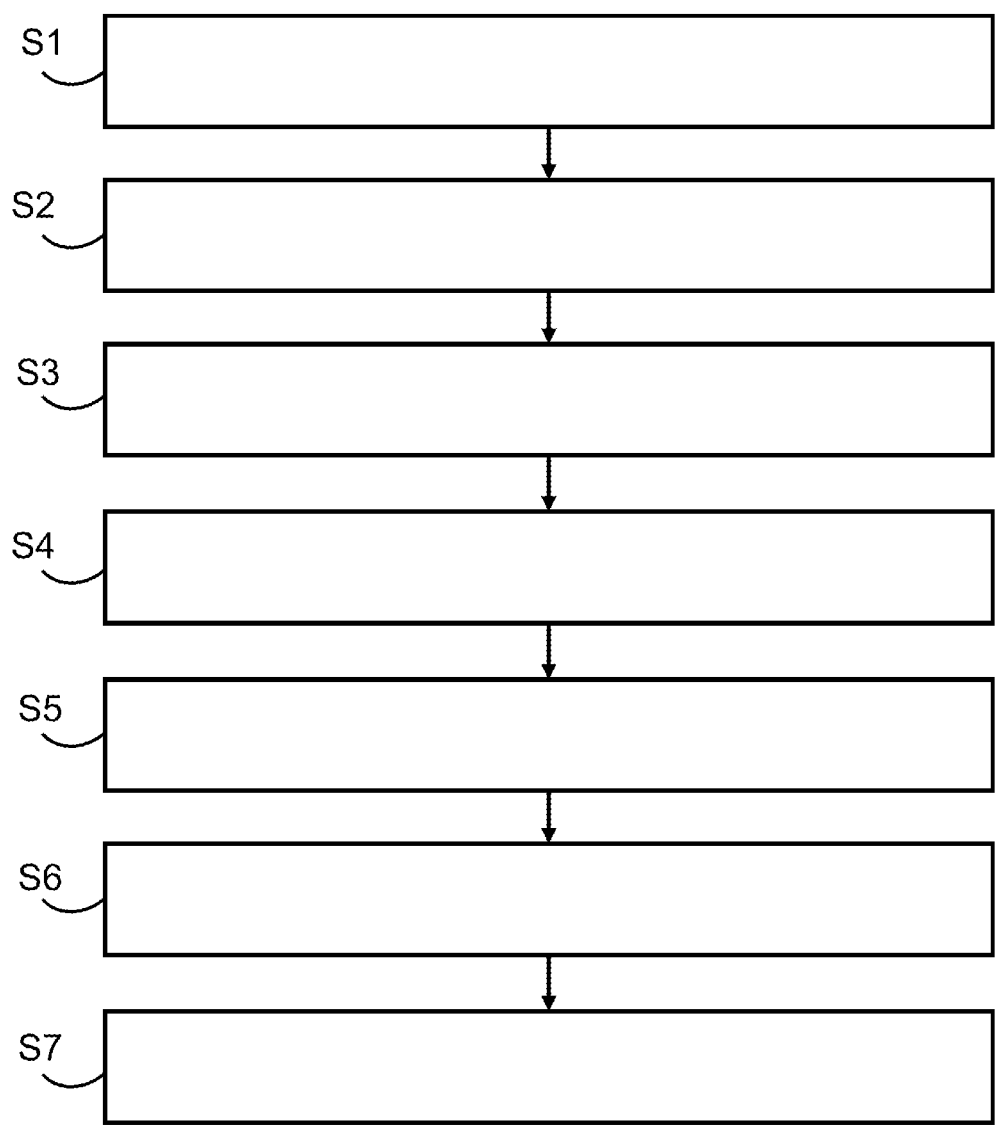
FIG. 4 shows a flowchart of the method according to the disclosure.

FIG. 4 now shows a flowchart of the method according to the disclosure, within the scope of which the concepts described according to FIGS. 3A-3H are applied. The method for area-wise inspecting a sample via a multi-beam particle microscope which operates using a plurality of individual charged particle beams, in this case comprises the following steps:

The provision of position data for a plurality of areas to be inspected d1 to d7 on the sample is implemented in method step S1. These position data may already be known, but it is also possible that these are only determined within the scope of the method according to the disclosure. By way of example, the position data can be generated via an optical inspection for recognizing semiconductor defects, and/or the position data can be generated on the basis of existing prior knowledge about the sample.

The provision of a first raster arrangement of the plurality of individual particle beams is implemented in a further method step S2, each individual particle beam being assigned a single field of view 61 to 72 on the sample 7. In this case, the first raster arrangement can be a regular hexagonal raster arrangement for example. However, any other regular embodiment of the raster arrangement or even an irregular arrangement of the raster arrangement is also possible. In this case, the first raster arrangement can be defined in a targeted manner or can be chosen according to optimization strategies—for example as described above with reference to FIGS. 3E to 3H— in order to speed up the method.

In a further method step S3, the position of a nominal scanning area 81 to 92 in each single field of view 61 to 72 is defined in relation to the first raster arrangement, with the dimensions of the nominal scanning area 81 to 92 being smaller than the complete single field of view 61 to 72. The position of the nominal scanning area in each single field of view 61 to 72 can in this case be defined on the basis of desirable criteria. By way of example, such criteria are maximizing the number of nominal scanning areas 81 to 92 which already in the first raster configuration at least partially cover, such as completely cover, the areas to be inspected d1 to d7. A further criterion is minimizing the number of individual particle beams 3 which are positioned differently in the second raster configuration in relation to the first raster configuration. A further criterion is restricting a position deviation of individual particle beams in the second raster arrangement in comparison with the first raster arrangement. These strategies also contribute to the speedup of the method.

Moreover, it is possible to choose the first raster arrangement, for example set a regular pitch between mutually adjacent individual particle beams in a targeted manner. As a result, it is possible for example to increase the number of areas to be inspected d1 to d7 which are located within a multi-field of view 60. Moreover, it can be desirable to distribute the areas to be inspected d1 to d7 as uniformly as possible among the single fields of view 61 to 72. Therefore—if there even is a defect—only a single defect d1 to d7 is present in most single fields of view 61 to 72 in FIGS. 3A-3H.

A nominal scanning area 81 to 92 is assigned to an area to be inspected d1 to d7 for at least one individual particle beam 3 in a further method step S4. There is a total of seven assignments in the example according to FIG. 3D.

An individual position deviation is determined in a further method step S5 between the nominal scanning area 81 to 92 and the area to be inspected d1 to d7, assigned thereto, for the at least one individual particle beam 3. Thus, this individual position deviation is determined for all pairs of nominal scanning areas and areas to be inspected. In this case, this position deviation may also be zero, specifically if the nominal scanning area already covers the area to be inspected (cf. nominal scanning areas 84 and 86 in FIG. 3D). Ultimately, the individual position deviation corresponds to the displacement of the nominal scanning area in the second raster arrangement in comparison with the first raster arrangement. By way of example, the individual position deviation is the displacement of the nominal scanning area 81 according to FIG. 3B comparison with the displaced nominal scanning area 81' in FIG. 3D.

The first raster arrangement is changed in accordance with the respectively determined individual position of the deviation and a second raster arrangement of the plurality of individual particle beams 3 is produced thereby in a further method step S6, such that the assigned areas to be inspected d1 to d7 can be scanned in a targeted fashion. An exemplary second raster arrangement is evident in FIG. 3C from the position of the nominal scanning areas or optionally the displaced nominal scanning areas. A corresponding statement applies to the illustration according to FIGS. 3D to 3E.

In a further method step S7, the sample 7 is scanned area-wise using the plurality of individual particle beams 3 in the second raster arrangement. As many as possible of the areas to be inspected d1 to d7, for example all, are scanned in the process. In the illustrated example of FIG. 3, this is successful using the raster configuration according to FIG. 3D but only partially successful via the second raster configuration according to FIG. 3C since the defect d6 was not scanned in FIG. 3C. Thus, the second raster configuration according to FIG. 3D can be more desirable overall, with a greater position deviation or a greater deflection of an individual particle beam 3 for the purposes of generating the second raster arrangement having to be accepted only in one case: Only the individual particle beam assigned to the field of view 68 is deflected by more than the single pitch. Nevertheless, the deflection in that case is less than twice the pitch in relation to the first raster arrangement. What generally holds true is that a position deviation of individual particle beams 3 in the second raster configuration in comparison with the first raster arrangement is only greater than or equal to the pitch in the first raster arrangement if more areas to be inspected (in this case: d6, d7) are arranged in the adjacent single field of view (sFOV), in relation to the first raster arrangement, obtained by this position deviation than in the single field of view (sFOV 68), in relation to the first raster arrangement, originally assigned to the individual electron beam 3. Specifically, no defect was present there.

Likewise second raster configurations can be gathered from FIGS. 3E, 3F, 3G, with setting the magnification bringing the greatest speedup in the illustrated example (cf. the explanations above).

The method can be carried out via a multi-beam electron microscope having a single column. In this case, the adjacent single fields of view 61 to 72 of the multi-beam particle microscope 1 overlap one another. Moreover, the area-wise scanning of the sample according to step S7 is implemented via a collective scan deflector for the individual particle beams. By contrast, an individual deflector, for example in the form of an individual deflector arrangement, is used for the individual deflection of single individual particle beams for the purposes of generating the second raster arrangement. By way of example, these might be a multi-stigmator elements in this case. However, it is also possible to provide a separate individual deflector arrangement.

Figure 5:
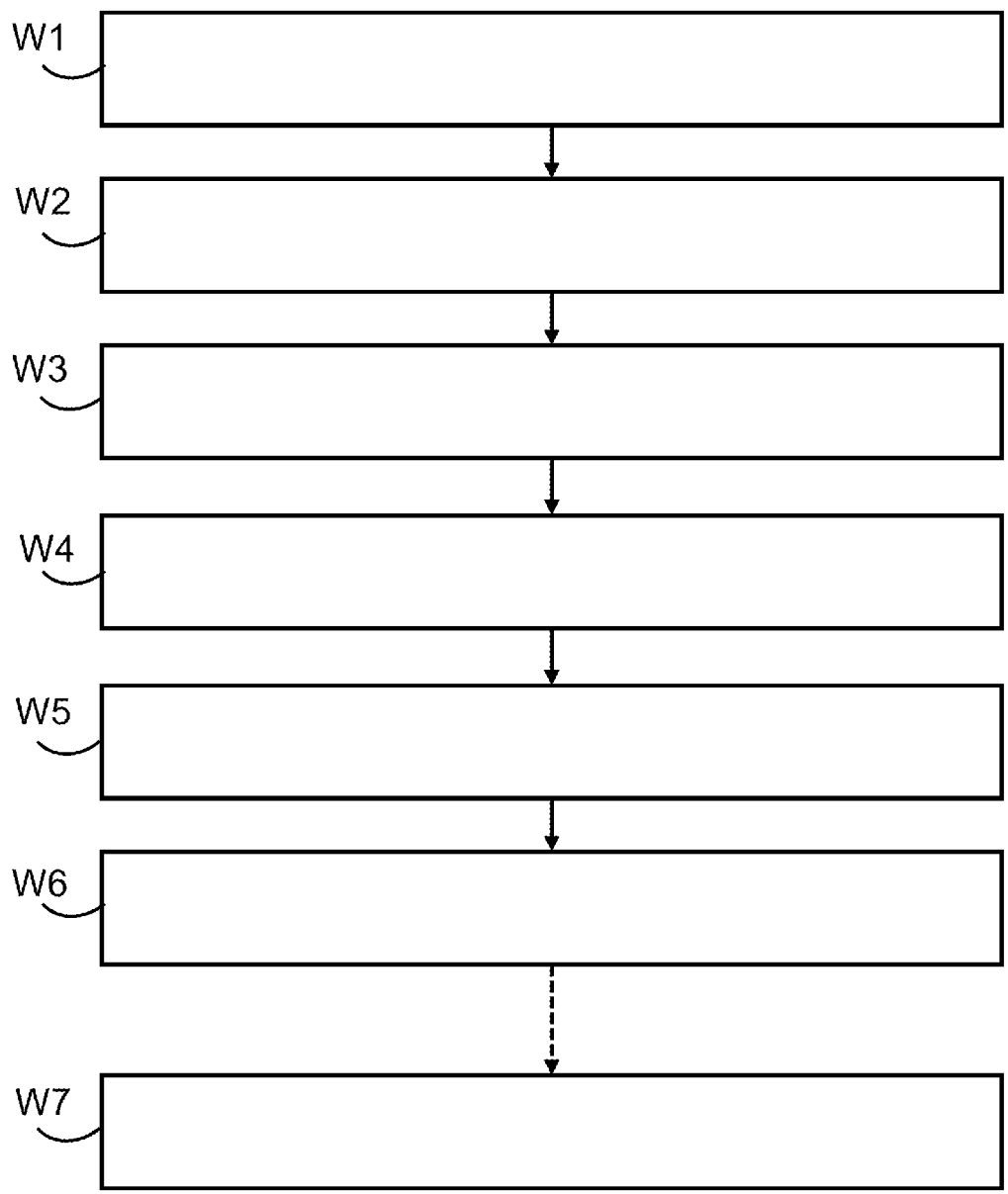
FIG. 5 shows a flowchart of a workflow for the area inspection of a sample.

FIG. 5 shows a flowchart of a workflow for the area inspection of a sample. In this case, it is not only a single multi-field of view 60 that is scanned area-wise but a plurality of multi-fields of view, for example n multi-fields of view, that are successively scanned area-wise. In a method step W1, control signals assigned to the position data in relation to a first multi-field of view mFOV1 are loaded into the collective scan deflector and into an individual deflector arrangement via a controller. In a method step W2, there then is—as described above in conjunction with FIG. 4—an area inspection of the mFOV1. Following the completion of this inspection, there is a sample movement or a stage move, within the scope of which the sample to be inspected is displaced relative to the multi-beam particle microscope 1. As a result, it is possible to area-wise inspect a further multi-field of view mFOV2: Once again, the control signals which are for the areas to be inspected and which are assigned to the position data are uploaded in a method step W4 and the individual deflector arrangement and the collective scan deflector 110 are controlled accordingly. The corresponding inspection of the second multi-field of view mFOV2 is then implemented in step W5. Subsequently, there is again a displacement of the sample 7 in relation to the multi-beam particle microscope 1 (stage move). This can be accordingly continued until the last multi-field of view, in this case the n-th multi-field of view mFOVn, has been area-wise inspected. Instead of uploading the position data per multi-field of view into the collective scan deflector and into the individual deflector arrangement, it is also possible to upload all control signals at once and then call/enable these via a trigger signal following a sample movement.

Figure 6:
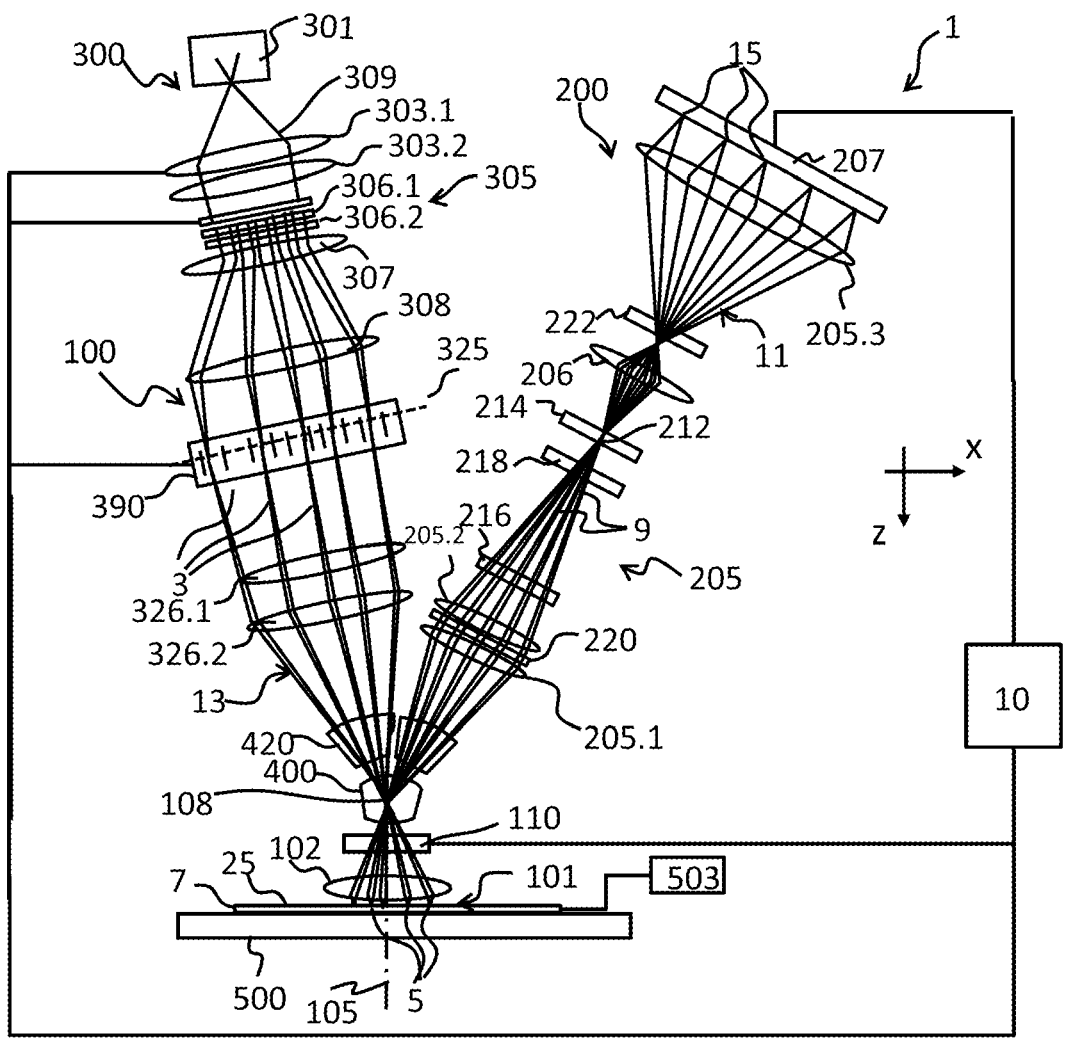
FIG. 6: schematically shows a multi-beam electron microscope having a single column for carrying out the method according to the disclosure.

FIG. 6 schematically shows a multi-beam electron microscope having a single column for carrying out the method according to the disclosure. FIGS. 1 and 6 correspond to one another but FIG. 6 shows more details in respect of the particle-optical elements. In FIG. 6, a collective scan deflector 110 is arranged in the area of the crossover 108. All individual particle beams are deflected equally via this collective scan deflector 110 and the scan deflector 110 is controlled via the controller 10 in such a way that the plurality of individual particle beams scan the sample surface 25 as desired. According to the method according to the disclosure, this scanning is implemented area-wise, with the plurality of the individual particle beams 3 being arranged according to the second irregular raster arrangement, which deviates from the regular first raster arrangement.

The second (irregular) raster arrangement is generated by a targeted deflection of selected individual particle beams. To this end, a deflection of the individual particle beams assigned to the selected area/areas to be inspected is carried out once (once provided a single set of nominal sample areas is provided), and this deflection is then maintained during the area scan in the multi-field of view (mFOV). Therefore, the adjustment is technically simple or can be implemented in low-frequency fashion at a rate of only a few hertz, for example 5 or 10 Hz. In the example shown in FIG. 6, the controller 10 can obtain the described beam deflection by way of controlling a multi-stigmator. The multi-stigmator is a constituent part of the micro-optics 306 and comprises the components 306.1 and 306.2 in the example shown. One or both of these components 306.1, 306.2 can be used to set the second raster arrangement. Additionally or alternatively, the individual deflector array 390 can also be controlled by way of the controller 10 for the purposes of setting the second raster arrangement. In the example shown, this is situated just downstream of the intermediate image plane 325, an arrangement within the intermediate image plane is not reasonable as only a very small positional change of the beams could be brought about in that case. In both discussed cases, the mechanism for the individual beam deflection are located at a position in which, firstly, the individual particle beams are well separated from one another and, secondly, the particle beam diameter of the individual particle beams is small in each case; however, in principle, other arrangements of the one-part or multi part individual deflector array are also possible.

FIG. 6 also shows details of the projection system 205. In addition to the projection lens system having a plurality of projection lenses 205.1, 205.2 and 205.3, this also comprises a further collective scan deflector 222, the so-called anti-scan. The latter is configured to guide the plurality of second individual particle beams which emanate from the sample 7 over the detection device 200. It is likewise controlled via the controller 10.

Positions of the second individual particle beams on the detection unit 200 can optionally be adjusted via an individual deflector array 220 which can be controlled in low-frequency fashion by way of the controller 1—whether this is used depends on the type of utilized detection unit 200. If a CMOS-type electron detector with a plurality of pixels is used, there is no need to use the individual deflector array 220 since only the assignment of the sensor pixels to the beam spots is different in that case.

Figure 7:
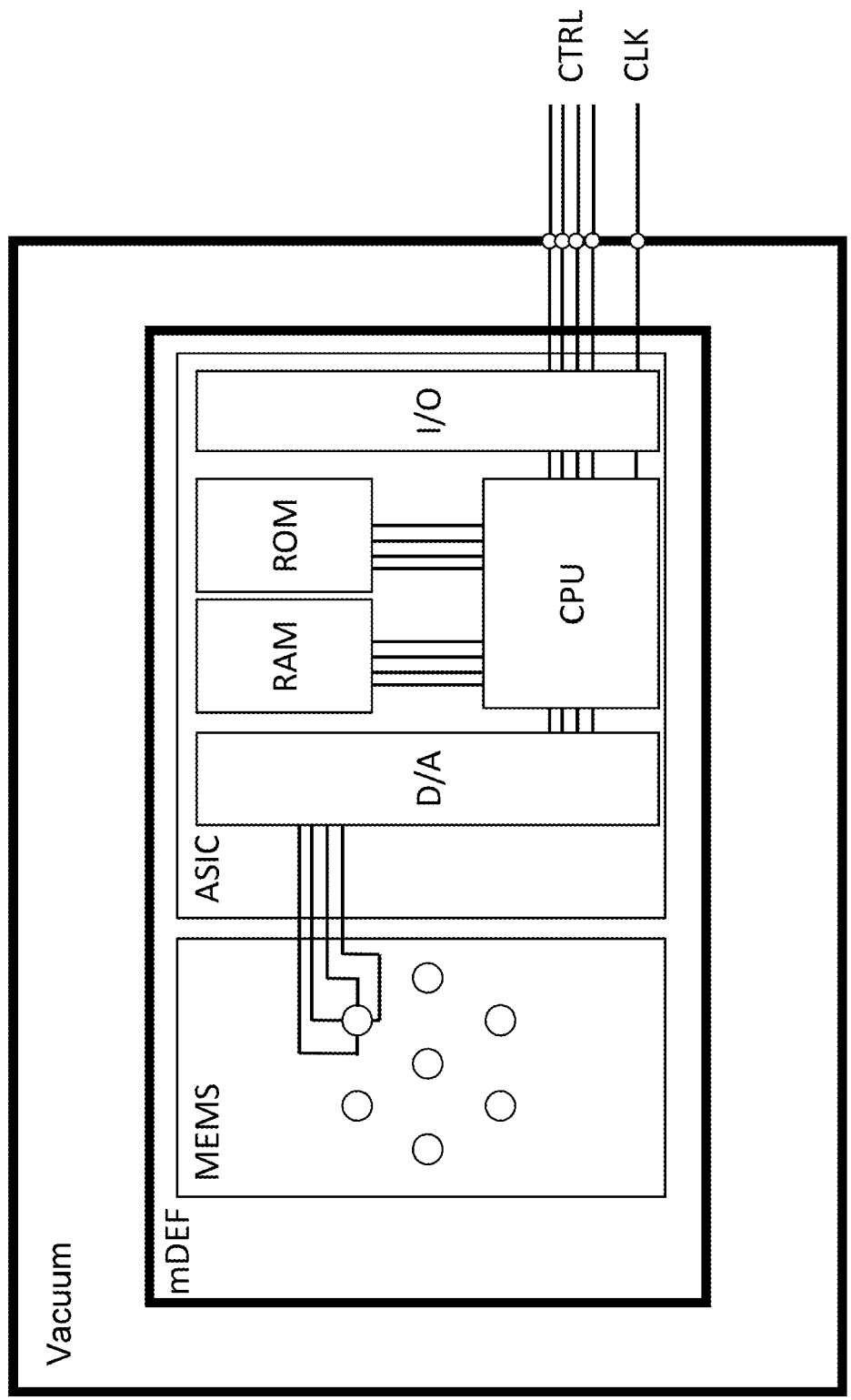
FIG. 7: schematically shows a multi-stigmator with a chip, which can be controlled via the clock signal.

FIG. 7 schematically shows a multi-stigmator, which comprises a chip with a memory. Specifically, FIG. 7 shows a multi-stigmator mDEF, which is arranged in vacuo. In the example shown, the multi-stigmator mDEF comprises two constituent parts or plates. Firstly, it comprises a plate with an application-specific integrated circuit (ASIC) and secondly comprises a plate with a microelectromechanical system (MEMS). The two plates may be, but need not be, fastened to one another. In the example shown, the ASIC plate comprises a CPU, a RAM, a ROM, an analogue-to-digital converter D/A and an input/output I/O. Control signals CTRL are fed to the CPU via the input/output I/O. These are guided into the vacuum from outside of the vacuum in which the multi-stigmator with Chip mDEF is situated. Additionally, a clock signal CLK is transmitted via a clock line via the I/O to the CPU. The control signals CTRL can be stored in the RAM and the CPU is used to control, via the digital-to-analogue converter D/A, the MEMS plate with the electrodes (in this case: octupoles) of the multi-stigmator or of the multi-stigmator array mDEF.

The provision of a clock line can result in limiting the number of control lines CTRL from outside of the vacuum into the vacuum in terms of their number or comparatively low. Moreover, it is not necessary to transmit the control signals synchronized in time with the scanning of the sample to the multi-stigmator mDEF: Instead, it is possible to upload the control signals CTRL and store these in the RAM memory in advance, for example during the calibration of the system or during a change in the field of view (multi-field of view change, often coupled to a stage movement). Then all that is still used is to transmit the clock signal CLK to the CPU at the right time so that the corresponding control signals CTRL are called from the RAM and transmitted via the D/A converter to the connectors of the MEMS plate or to the octupoles. FIG. 7 only shows 4 lines for an octupole in exemplary fashion; the wiring of the other octupoles on the MEMS plate is implemented accordingly.

Thus, using the exemplary embodiment depicted in FIG. 7, it is possible to upload into the RAM memory a sequence of control signals for the multi-stigmator mDEF for the purposes of producing the second raster arrangement and to activate the next control signal via a trigger signal, in this case the CLK signal. Thus, the sequence of control signals CTRL is stored or buffered in the RAM memory of the chip, the storing process itself can be implemented once. However, it is alternatively also possible to supply the multi-stigmator mDEF after each stage move, that is to say before the scanning of the next multi-field of view starts, with control signals CTRL or data for the specific control.

LIST OF REFERENCE SIGNS

1 Multi-beam particle microscope
3 Primary particle beams (individual particle beams)
5 Beam spots, incidence locations
7 Object
8 Sample stage
9 Secondary particle beams
10 Computer system, controller
11 Secondary particle beam path
13 Primary particle beam path
25 Sample surface, wafer surface
50 Single field of view (individual beam system)
51 Area of the single field of view 50
51 Area of the single field of view 50
52 Area of the single field of view 50
53 Area of the single field of view 50
54 Area to be inspected of the single field of view 50
55 Area to be inspected of the single field of view 50
56 Area to be inspected of the single field of view 50
60 Multi-field of view (mFOV)
61 to 76 Single field of view (multi beam system)
81 to 96 Nominal scanning area
81' to 96' Displaced nominal scanning area
d1 to d7 Defect, area to be inspected
100 Objective lens system
101 Object plane
102 Objective lens
103 Field
105 Optical axis of the multi-beam particle microscope
108 Cross-over
110 Collective scan deflector
200 Detector system
205 Projection lens
206 Electrostatic lens
207 Detection region
208 Deflector
209 Particle multi-detector
211 Detection plane
212 Cross-over
213 Incidence locations
214 Aperture filter
215 Detection region
216 Active element
217 Field
218 Deflector system
220 Multi-aperture corrector, individual deflector array
222 Collective deflection system, anti-scan
300 Beam producing apparatus
301 Particle source 303 Collimation lens system
305 Multi-aperture arrangement
306 Micro-optics
307 Field lens
308 Field lens
309 Diverging particle beam
311 Illuminating particle beam
313 Multi-aperture plate
315 Openings in the multi-aperture plate
317 Midpoints of the openings
319 Field
323 Beam foci
325 Intermediate image plane
326 Field lens system
390 Individual deflector array, individual deflector arrangement
400 Beam switch
420 Magnetic element
500 Sample stage
503 Voltage supply for the sample
c Lower limit, cut-off
MAX Maximum value of the distribution
ROI d Minimum distance of the nearest neighbour for areas to be inspected/defects
S1 Position data for areas to be inspected
S2 Providing a first raster arrangement
S3 Defining nominal scanning areas
S4 Assigning nominal scanning areas to areas to be inspected
S5 Determining position deviations
S6 Producing a second raster arrangement
S7 Area inspection
W1 Position data mFOV1
W2 Inspection mFOV1
W3 Sample movement
W4 Position data mFOV2
W5 Inspection mFOV2
W6 Sample movement
W7 Inspection mFOVn

What is claimed is:

1. A method of area-wise inspecting a sample using a multi-beam particle microscope which generates a plurality of individual charged particle beams, the method comprising:
   providing position data for a plurality of areas on the sample;
   providing a first raster arrangement of the plurality of individual particle beams, a single field of view on the sample being assigned to each individual particle beam;
   defining a position of a nominal scanning area in each individual field of view relative to the first raster arrangement, dimensions of the nominal scanning area being smaller than a complete single field of view;
   assigning a nominal scanning area to an area to be inspected for at least one individual particle beam;
   for the at least one individual particle beam, determining an individual position deviation between the nominal scanning area and the area to be inspected assigned to the at least one individual particle beam;
   changing the first raster arrangement according to the determined individual position deviation to produce a second raster arrangement of the plurality of individual particle beams so that the assigned areas to be inspected are scannable in a targeted fashion; and
   area-wise scanning the sample using the plurality of individual particle beams in the second raster arrangement.

2. The method of claim 1, wherein producing the second raster arrangement comprises an individual deflection of the at least one individual particle beam.

3. The method of claim 1, further comprising, when area-wise scanning the sample in the second raster arrangement, using a collective scan deflector to deflect all the individual particle beams.

4. The method of claim 1, wherein most of the assigned areas to be inspected are assigned to nominal scanning areas located in the same single field of view relative to the first raster arrangement.

5. The method of claim 1, wherein at least one of the following holds: mutually adjacent single fields of view of the multi-beam particle microscope overlap; and the multi-beam particle microscope comprises a single column.

6. The method of claim 1, wherein providing the first raster arrangement comprises setting of a regular pitch between mutually adjacent individual particle beams.

7. The method of claim 6, wherein setting the pitch is performed according to at least one of the following criteria:
   increasing a number of areas to be inspected which are located within a multi-field of view; and uniformly distributing the areas to be inspected among the single fields of view (sFOVs).

8. The method of claim 7, wherein a predetermined proportion of all multi-fields of view have only single fields of view which have either no areas to be inspected or only a predetermined number of areas to be inspected.

9. The method of claim 8, wherein the predetermined proportion of all single fields of view has exactly one area to be inspected.

10. The method of claim 1, wherein providing the first raster arrangement comprises optimizing the first raster arrangement by changing a position, a pitch and/or a rotation of the first raster arrangement.

11. The method of claim 1, wherein the first raster arrangement is optimized according to at least one of the following criteria:
    arranging each area to be inspected completely within a single field of view of the raster arrangement;
    maximizing a distance between areas to be inspected and edges of single fields of view; and
    uniformly distributing areas to be inspected among the single fields of view.

12. The method of claim 1, further comprising:
    producing a distance distribution of areas to be inspected from the provided position data; and
    optimizing the first raster arrangement based on the produced distance distribution.

13. The method of claim 12, further comprising:
    choosing a lower limit of a minimum distance between areas to be inspected in the distance distribution so that a predetermined proportion of all areas to be inspected has a minimum distance greater than or equal to this lower limit; and
    setting a pitch of the first raster arrangement to the lower limit.

14. The method of claim 13, wherein the predetermined proportion is at least 95%.

15. The method of claim 1, wherein the position of the nominal scanning area in each single field of view is defined according to at least one of the following criteria:
    maximizing the number of nominal scanning areas which already in the first raster configuration at least partially cover the areas to be inspected;

minimizing the number of individual particle beams which are positioned differently in the second raster configuration in relation to the first raster configuration; and restricting a position deviation of individual particle beams in the second raster arrangement in comparison with the first raster arrangement.

16. The method of claim 15, wherein the restriction leads to the position deviation of the individual particle beams being less than twice the pitch or less than the single pitch between mutually adjacent individual particle beams in the first raster arrangement.

17. The method of claim 1, wherein, compared to the first raster arrangement, a position deviation of individual particle beams in the second raster configuration is greater than or equal to the pitch in the first raster arrangement only when more areas to be inspected are arranged in the adjacent single field of view relative to the first raster arrangement obtained by the position deviation than in the single field of view relative to the first raster arrangement.

18. The method of claim 1, wherein at least one of the following holds: the position data are generated via an optical inspection for recognizing semiconductor defects; and the position data are generated on the basis of existing prior knowledge about the sample.

19. The method of claim 1, further comprising at least partially repeating the method.

20. The method of claim 1, further comprising performing the method for a plurality of multi-fields of view, and displacing the sample relative to the multi-beam particle microscope between the area-wise inspection of various multi-fields of view.

21. The method of claim 1, wherein:
the multi-beam particle microscope comprises a multi-aperture arrangement comprising a multi-beam generator a multi-stigmator;
the multi-beam generator comprises a multi-aperture plate and a multi-lens array; and
the multi-stigmator is used to produce the second raster arrangement.

22. The method of claim 1, wherein the multi-beam particle microscope comprises:
a multi-beam generator configured to generate a first field of a plurality of charged first individual particle beams;
a first particle optical unit having a first particle optical beam path, the first particle optical unit configured to image the charged first individual particle beams onto a sample surface in an object plane so that the charged first individual particle beams impinge on the sample surface at incidence locations which form a second field;
a detection system comprising a multiplicity of detection regions defining a third field;
a second particle optical unit having a second particle optical beam path, the second particle optical unit configured to image second individual particle beams, which emanate from the incidence locations in the second field, onto the third field of the detection regions of the detection system;
a magnetic and/or electrostatic objective lens configured so that both the first and the second individual particle beams pass through therethrough;
a beam switch disposed in the first particle optical beam path between a multi-beam particle source and the objective lens, the beam switch disposed in the second particle optical beam path between the objective lens and the detection system;
a collective scan deflector disposed between the beam switch and the sample surface, the collective scan deflector configured to collectively scan the sample surface using the plurality of charged first individual particle beams;
an individual deflector arrangement disposed between the multi-beam generator and the collective scan deflector, the individual deflector configured to, in each case, deflect the first individual particle beams on an individual basis, a deactivated individual deflector arrangement or an individual deflection that is identical for all first individual particle beams corresponding to a first raster arrangement of the first individual particle beams and an activated individual deflection that is not identical for all first individual beams corresponding to a second raster arrangement of the first individual particle beams; and
a controller is configured to provide:
low-frequency control of the individual deflector arrangement to produce the second raster arrangement; and
high-frequency control of the collective scan deflector so that portions of the sample surface located in a multi-field of view are scanned using the first individual particle beams in the second raster arrangement.

23. One or more machine-readable hardware storage devices comprising instructions that are executable by one or more processing devices to perform operations comprising the method of claim 1.

24. A system, comprising:
one or more processing devices; and
one or more machine-readable hardware storage devices comprising instructions that are executable by the one or more processing devices to perform operations comprising the method of claim 1.

* * * * *

UNITED STATES PATENT AND TRADEMARK OFFICE
CERTIFICATE OF CORRECTION

PATENT NO. : 12,272,519 B2
APPLICATION NO. : 17/843215
DATED : April 8, 2025
INVENTOR(S) : Dirk Zeidler and Daniel Boecker Page 1 of 1

It is certified that error appears in the above-identified patent and that said Letters Patent is hereby corrected as shown below:

In the Specification

Column 28, Line 31, delete "51 Area of the single field of view 50"

Signed and Sealed this
Twentieth Day of May, 2025

Coke Morgan Stewart
*Acting Director of the United States Patent and Trademark Office*